United States Patent
Mikata et al.

(10) Patent No.: US 9,310,408 B2
(45) Date of Patent: Apr. 12, 2016

(54) POWER DEVICE ANALYZER

(71) Applicant: Keysight Technologies, Inc., Minneapolis, MN (US)

(72) Inventors: Atsushi Mikata, Loveland, CO (US);
Hisao Kakitani, Loveland, CO (US);
Koji Tokuno, Loveland, CO (US);
Shinichi Tanida, Loveland, CO (US);
Yoshimi Nagai, Loveland, CO (US)

(73) Assignee: Keysight Technologies, Inc., Santa Rosa, CA (US)

(*) Notice: Subject to any disclaimer, the term of this patent is extended or adjusted under 35 U.S.C. 154(b) by 334 days.

(21) Appl. No.: 13/869,221

(22) Filed: Apr. 24, 2013

(65) Prior Publication Data

US 2013/0320959 A1    Dec. 5, 2013

Related U.S. Application Data

(60) Provisional application No. 61/640,645, filed on Apr. 30, 2012.

(51) Int. Cl.
*G01R 25/00* (2006.01)
*G01R 29/26* (2006.01)
*G01R 31/26* (2014.01)

(52) U.S. Cl.
CPC ............... *G01R 25/00* (2013.01); *G01R 29/26* (2013.01); *G01R 31/2603* (2013.01)

(58) Field of Classification Search
CPC .... G01R 25/00; G01R 31/2603; G01R 31/42; G01R 31/31922; G01R 19/0053; G01R 29/26
USPC ........................................................ 324/555
See application file for complete search history.

(56) References Cited

U.S. PATENT DOCUMENTS

| | | | | |
|---|---|---|---|---|
| 3,505,598 A * | 4/1970 | Merrill | ........................ | 324/76.17 |
| 4,074,195 A * | 2/1978 | Hunt | ........................ | 324/762.01 |
| 5,557,196 A * | 9/1996 | Ujiie | ........................ | G01R 29/26 |
| | | | | 324/76.13 |
| 6,054,865 A * | 4/2000 | Bald | ........................ | G01R 27/20 |
| | | | | 324/545 |
| 6,584,419 B1 * | 6/2003 | Alexander | ........................ | 702/68 |
| 2005/0209801 A1 * | 9/2005 | Hashimoto | ........ | G01R 31/31924 |
| | | | | 702/64 |
| 2005/0237079 A1 * | 10/2005 | Tanida et al. | ........................ | 324/765 |
| 2007/0067121 A1 * | 3/2007 | Przydatek | ............ | G01R 22/065 |
| | | | | 702/57 |
| 2012/0086462 A1 * | 4/2012 | Ishida | .............. | G01R 31/31721 |
| | | | | 324/601 |
| 2012/0194202 A1 * | 8/2012 | Xiao | .................... | H02H 7/1203 |
| | | | | 324/548 |

* cited by examiner

*Primary Examiner* — Melissa Koval
*Assistant Examiner* — Felicia Farrow

(57) ABSTRACT

A device analyzer for analyzing power devices. An example device analyzer comprises a collector supply to generate supply signal pulses with selected voltage or current levels and a supply signal pulse width at a high current. The supply signal pulses are applied at a collector supply source terminal when DUT is connected to conduct current between the collector supply source terminal and a collector supply common terminal. A supply switch closes or opens the DUT current path in narrow pulses having a narrow pulse width narrower than the supply signal pulses to conduct the supply signal pulses as narrowed sweep signal pulses having the high current capacity of the collector supply current. The supply switch alternatively regulates the current in the current path at constant current levels. Other modules capable of high power test capabilities may also be added.

19 Claims, 22 Drawing Sheets

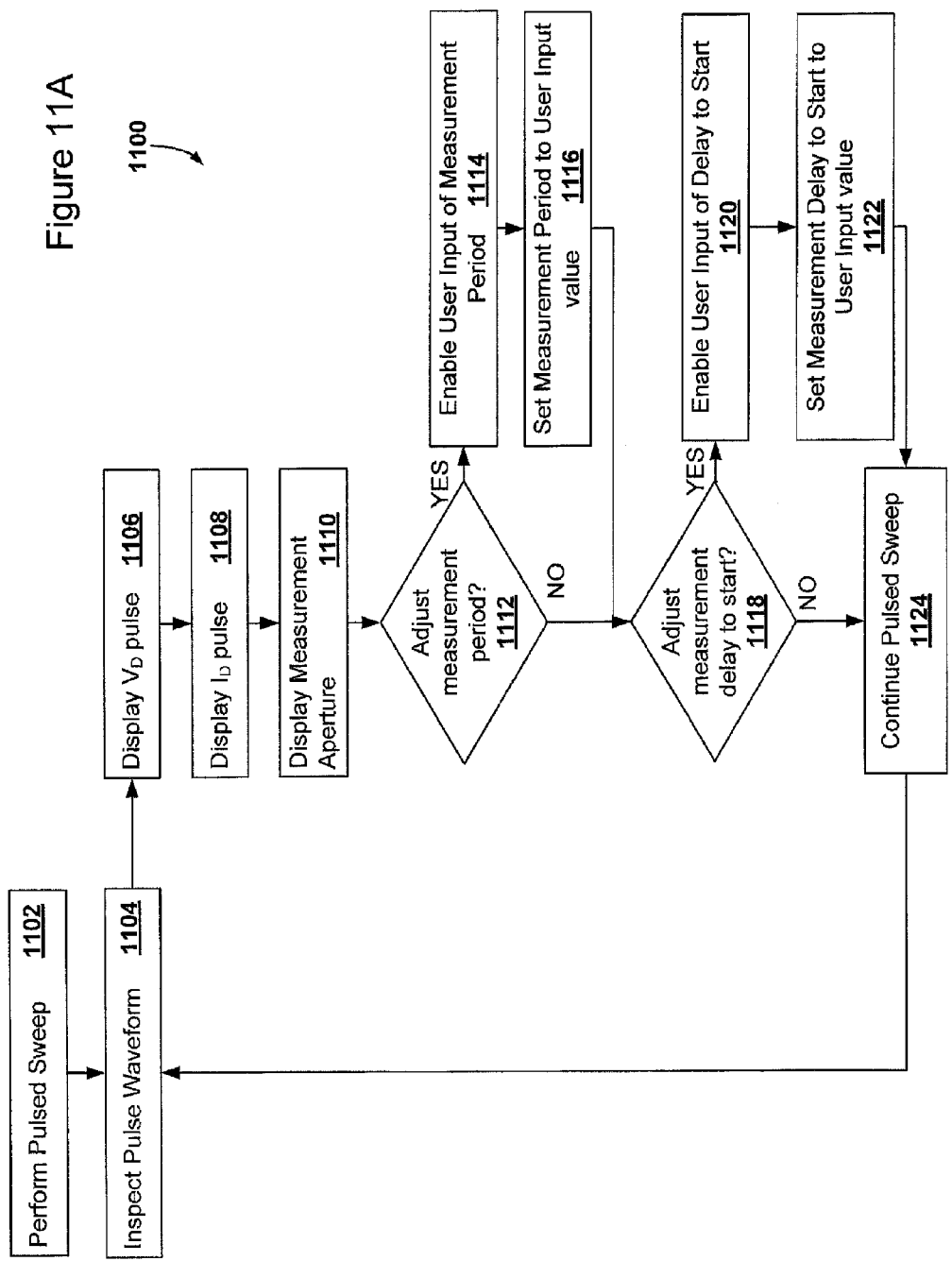

POWER DEVICE ANALYZER

RELATED APPLICATIONS

This application claims priority under 35 U.S.C. §119(e) of U.S. Provisional Application Ser. No. 61/640,645, filed on Apr. 30, 2012, titled POWER DEVICE ANALYZER, the content of which is incorporated by reference herein in its entirety.

TECHNICAL FIELD

The present invention relates generally to device analyzers and curve tracers, and particularly to analyzers utilized in characterizing power devices.

BACKGROUND

Electronic devices are typically rated, or characterized, according to certain parameters to which designers refer when selecting devices for particular applications. Non-linear devices, such as diodes, transistors, solid-state switches, and other such types of devices, are being developed to operate in a wide variety of environments and applications using a wide variety of solid-state technologies. The device's static characteristics determine the device's suitability for particular environments and applications.

Electronic device manufacturers rely on device analyzers to test and characterize electronic devices to provide the device's static characteristics. Device analyzers are equipped with tools for a device by applying a test signal from a power source, and measuring selected parameters at the device-under-test ("DUT"). Device analyzers generally use a curve tracer, which measures both voltage and current at the DUT and plots the measured values as current-voltage ("I-V") curve traces. The power source applies the test signal to the DUT as a series of voltage and/or current levels in what is known as a "sweep." The sweep may be a voltage sweep or a current sweep over a range from a minimum level to a maximum level (or from a maximum level to a minimum level) depending on which parameter is controlled at the power source, and the voltage and current are measured at the DUT for each level of the test signal at the DUT. For each sweep, a curve representing the measured values is generated.

Devices having two terminals, such as for example, diodes, may be characterized by a single curve in a single sweep, although other tests not involving test signals in sweeps may be performed as well. Devices having more than two terminals may require multiple sweeps to generate multiple curve traces to test conditions involving signals applied to other terminals. Typically, devices comprise a drain terminal and a source terminal and power is typically applied across the drain and source terminal. Other terminals on the device may be used to vary the operation of the device by affecting the voltage and current levels at the drain and source terminals according to voltage and/or current levels applied to the other terminals. Three-terminal devices, which include transistors (based on a wide variety of technologies such as bipolar junctions, field-effect or "FET," and involving a wide variety of semiconductor materials and configurations such as metallic oxide semiconductors, or "MOS," FET's) and other switch-like devices, operate using three-terminals. A gate terminal is used to affect the voltage and current at the drain and source terminals, as for example, an on-off switch or as a bias for regulating the voltage and/or current levels. The I-V curve traces generated for three-terminal devices typically appear as a series of curves generated at varying gate signal levels. Curve traces and their utility in characterizing electronic devices are wellknown in the art.

Device analyzers may perform tests and measurements that require subjecting devices to environments involving conditions that approach or even exceed the device's safe operating area ("SOA"). Until recently, the vast majority of electronic devices have been designed for applications involving DC power sources that are relatively low, such as five volts, or even 12 volts or 24 volts. Device analyzers have been generally capable of testing at such environments.

A growing awareness of the need to conserve energy resources has resulted in the development and increasing demand for power devices that are characterized by a high breakdown voltage and capability of high current density. Wide Band Gap Devices such as for example, devices made with GaN (gallium nitride) and SiC (Silicon Carbide), are attracting attention as devices made with materials with high-temperature properties, withstand voltage characteristics, conduction loss, and transient loss. The ability to perform precise measurement of the characteristics of such devices subjected to high voltage and high current is becoming more important and challenging. Testing requirements of such new power devices are exceeding the power capabilities of current device analyzers.

One problem that arises in testing power devices involves subjecting the device to high voltages and high currents that can destroy the device. Some device analyzers are configured to perform pulsed sweeps. The test signal is applied in pulses and voltage/current measurements are made within the period of the pulse to minimize the amount of time the device is subjected to excess current levels. Known device analyzers typically use pulsed test signals with pulse widths that are too long to adequately protect the DUT from self-heating. The pulse widths are also typically fixed and often not known precluding the ability to modify the pulse width for the needs of specific tests or devices. Known device analyzers also typically lack sufficient power capacity to test high power devices at or near their SOA's. While the limitations of known device analyzers are being exposed by the increasing demand for testing high power devices, existing silicon devices are being developed with lower and lower losses further challenging the capabilities of known device analyzers.

Devices are also being developed using new technologies that require testing in wider and wider ranges. For example, the on-resistance of Laterally Diffused Metal Oxide Semiconductors ("LDMOS") with a trench structure may be less than 1 milliohm. In another example, the saturation voltage of an insulated gate bipolar transistor ("IGBT") is less than 1V. Reliability testing at high voltage requires obtaining I-V characteristics where the operating point is close to the device's SOA (Safe Operating Area). New device technologies also result in new effects or device behaviors to test for and characterize. For example, GaN devices are subject to a phenomenon known as "current collapse." In addition, the on-resistance of power devices is becoming more difficult to measure precisely at such high power levels. Such effects or phenomena cannot be measured or studied effectively via I-V curve traces alone. However, many of the devices analyzed by device analyzers with curve tracers are in integrated circuits, and testing is typically automated and performed onwafer. The addition of different apparatuses or complicating test protocols for characterizing devices would adversely affect the development and manufacturing cycle.

In view of the foregoing, there is an ongoing need for device analyzers having sufficient power capacity to generate I-V characteristics, and to efficiently perform other types of measurements for high power devices at or above their SOAs without damaging the DUT.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

FIG. 11A is a flowchart of an example method for inspecting a pulse waveform.

DETAILED DESCRIPTION

As used herein, the term "DC supply" refers to a voltage source that supplies direct current as an un-pulsed signal generated as a voltage level. It is known to those of ordinary skill in the art that "DC" generally refers to direct current flowing in one direction from a first terminal of a power source to an opposite terminal of the power source, and that such direct current may vary in level so as to form waveforms generated as pulses. The term "DC supply" shall refer herein to a voltage supply that generates a direct current at a voltage level that is not pulsed.

As used herein, the term "curve tracer" refers to a device that includes a voltage and/or current source for applying a test signal (a voltage and/or current with desired test characteristics) to a device-under-test ("DUT"), and a meter (a voltmeter and/or ammeter) for measuring the voltage and/or current at selected terminals of the DUT. A curve tracer is used to generate I-V curve traces, and to perform measurements to determine the static or I-V characteristics of the DUT.

As used herein, the terms "drain voltage" and "drain current" refer to voltage and current values across and between the drain-source terminals, respectively, of a DUT. While a "drain" and a "source" typically refer to parts of a field effect transistor, or "FET," the terms "drain voltage" and "drain current" shall refer to corresponding signal values for other types of devices. For example, as used herein, the term "drain voltage" shall be understood to refer to a "collector voltage" in the context of a bipolar junction transistor ("BJT"). Similarly, the term "drain current" shall be understood to refer to a "collector current."

As used herein, the term "collector supply" shall refer to a power supply that is used to apply power to a DUT at a drain terminal (or a collector terminal for a BJT) where the DUT source terminal (or emitter terminal for a BJT) is connected to a current return path of the power supply.

I. Power Device Analyzer

Figure 1:
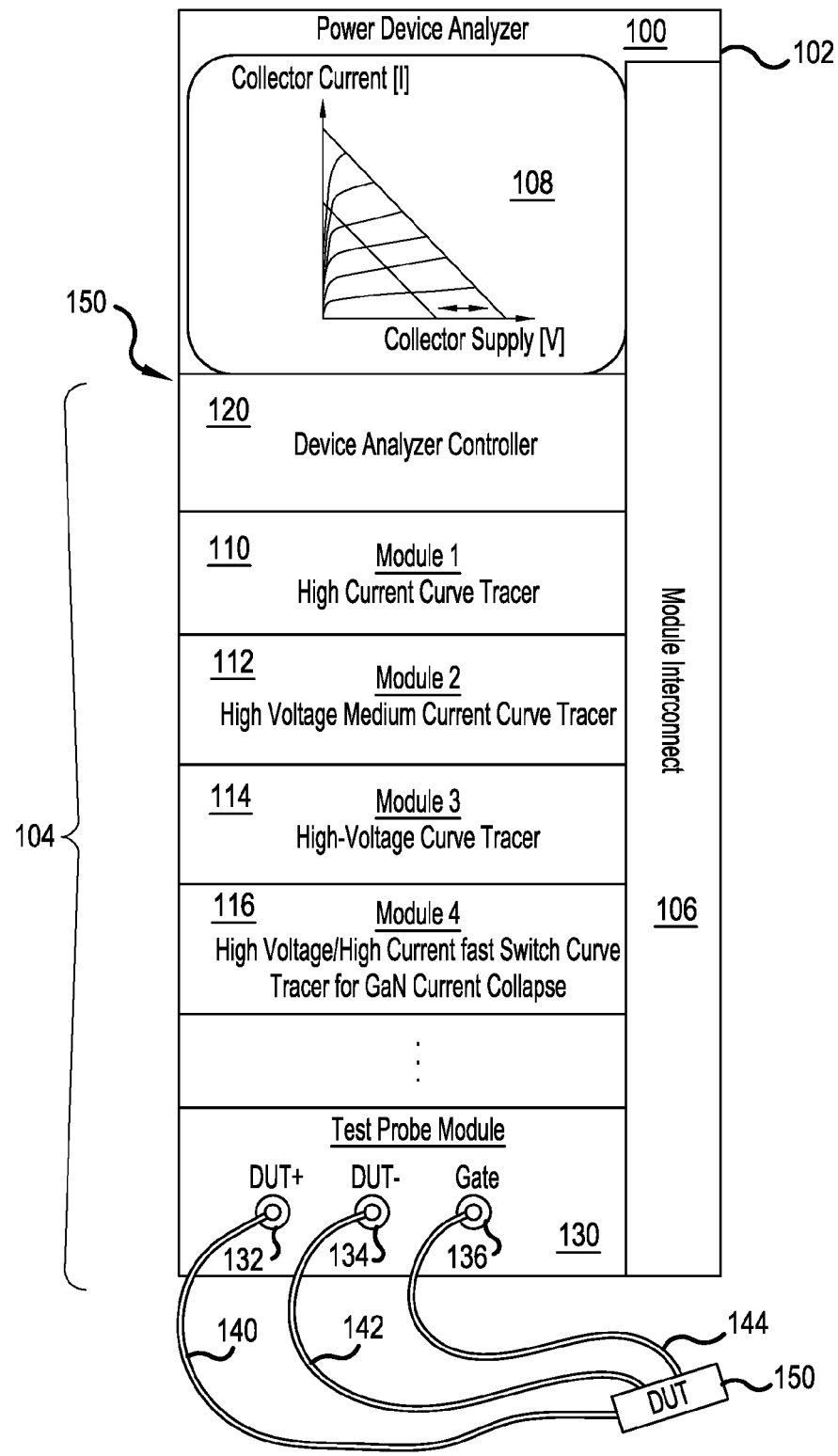
FIG. 1 is a schematic diagram of an example of a device analyzer.

FIG. 1 is a schematic diagram of an example of a device analyzer 100. The device analyzer 100 in FIG. 1 includes an analyzer housing 102, a plurality of module bays 104, a module interconnect 106, a waveform monitor 108, a device analyzer controller 120, and a test probe module 130. The device analyzer 100 in FIG. 1 is user-configurable by selectively including curve trace modules in the module bays 104 that provide a variety of options for analyzing high power devices. The device analyzer controller 120 may be programmed to control the overall operation of the device analyzer 100 by enabling a selected one of the modules to perform testing, and to provide the module with access to the waveform monitor 108 and the test probe module 130. In an example implementation, the device analyzer controller 120 may control system operation while allowing processors in the individual curve trace modules to control processing for performing device analysis. In another implementation, the device analyzer controller 120 may provide processing resources for any of the modules included in the device analyzer 100 as well as system management.

The device analyzer 100 is illustrated in FIG. 1 as capable of testing a single device-under-test ("DUT") 150. However, the device analyzer 100 may be configured to measure DUTs in batches by including a suitable test probe module 130 and providing a suitable testing environment. It is to be understood by those of ordinary skill in the art that the reference in the discussion below to a single DUT does not limit the device analyzer 100 from use in a batch testing environment.

The module bays 104 shown in FIG. 1 include a high current curve trace module 110, a high-voltage medium-current curve trace module 112, a high-voltage curve trace module 114, and a high-voltage, high-current fast switch curve trace module 116. The curve trace modules 110, 112, 114, 116 in FIG. 1 are described below with reference to FIGS. 2-16. Each curve trace module 110 et seq. includes hardware and software components configured to perform measurements for characterizing a device, which may include performing I-V curve traces. The module bays 104 in FIG. 1 include curve trace modules 110, 112, 114, 116; however, the device analyzer 100 may be configured to operate with one or any number of the curve trace modules 110, 112, 114, 116. The module bays 104 may also be populated with modules that provide accessory functions for the device analyzer 100. For example, a module may be included to permit connectivity to a computer or a server, or for connecting various input or output devices.

The module interconnect 106 electrically connects the plurality of module bays 104 and other resources to provide electrical and control connectivity to the high current curve trace module 110 any other curve trace module included in the device analyzer 100. The module interconnect 106 may also operate as a bus for the device analyzer controller 120 and further connect the waveform monitor 108 and the test probe module 130.

The waveform monitor 108 in FIG. 1 is connected to the module interconnect 106 to display voltage and current measurements from the high current curve trace module 110 and any other curve trace module included in the device analyzer 100. The waveform monitor 108 is describe here as the output for displaying test results and measurement related information. However, the waveform monitor 108 may also provide a graphical user interface to the user for inputting data and control information from the user or for displaying control information relating to operation of the device analyzer 100 as well as to the test measurements. The device analyzer 100 may include other input/output ("I/O") devices and suitable drivers not illustrated or described herein to allow the user to initiate testing, configure and maintain the device analyzer 100, and receive test results.

The device analyzer controller 120 provides processing resources to control operation of the device analyzer 100. The device analyzer controller 120 includes a central processing unit, memory (e.g. RAM, ROM, non-volatile memory, magnetic, or optical, or any other suitable type of memory), I/O, and any other computing resource suitably configured for the device analyzer 100. The device analyzer controller 120 may provide processor control for the high current curve trace module 110, and any other curve trace module included in the device analyzer 100.

The test probe module 130 provides connections to and from a selected one of either the high current curve trace module 110 or any of the other curve trace modules, and the DUT 150. The DUT 150 may be connected via a first probe 140 connected to a first DUT port 132 on the test probe module 130, and a second probe 142 connected to a second DUT port 134 on the test probe module 130. The first DUT port 132 may be configured to contact a first terminal of the DUT 150, and the second DUT port 134 to contact a second terminal of the DUT 150 during a measurement. Where the DUT 150 is a three-terminal device, a Gate port 136 on the test probe module 130 may be used to connect a third probe 144 to a third terminal on the DUT 150.

II. High-Current Curve Trace Module

Figure 2:
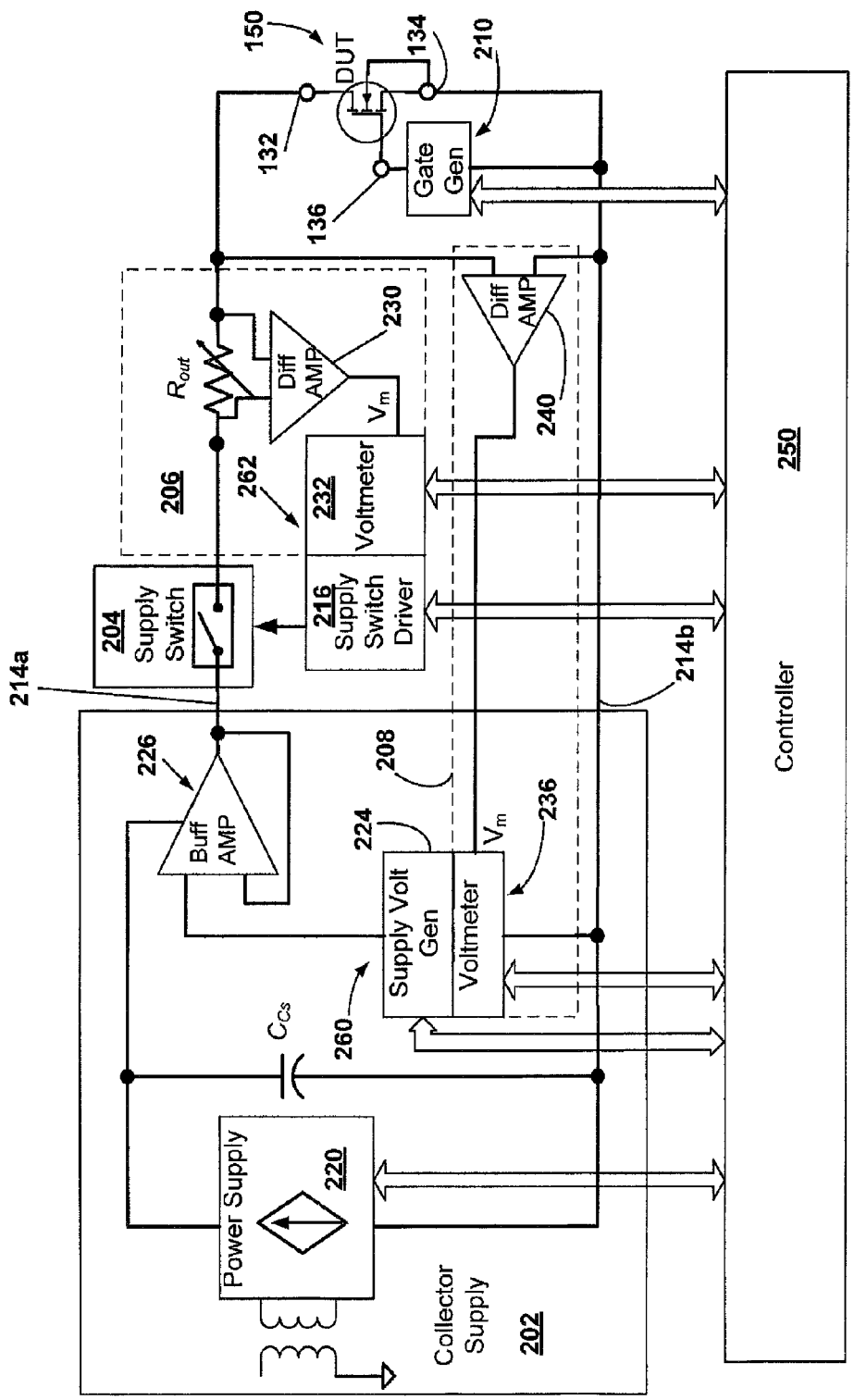
FIG. 2 is a schematic diagram an example of a high-current curve trace module.

FIG. 2 is a schematic diagram an example of a high-current curve trace module 200. The high-current curve trace module 200 in FIG. 2 includes a collector supply 202, a supply switch 204, a current meter 206, and a voltage meter 208. The high-current curve trace module 200 is controlled to operate in one of two modes: a narrow pulse voltage mode and a constant current source mode. A controller 250 is provided to control the operation of the high-current curve trace module 200.

In an example implementation, the high-current curve trace module 200 operates in the narrow pulse voltage mode by generating a plurality of variable signal pulses (i.e. variable voltage or variable current pulses) with a high current capacity. The plurality of variable signal pulses is applied in either voltage or current signal sweeps to the DUT 150. The signal pulses are narrow pulses and have a controllable pulse width. The variable voltage or current pulses with the narrow pulse width are applied to the DUT 150. During the narrow pulse width period, the current meter 206 measures the current $I_D$ through the DUT 150, and the voltage meter 208 measures the voltage $V_D$ across the DUT 150. In the constant current source mode, the supply switch 204 is controlled to regulate the current level $I_D$ to remain constant at a selected level regardless of the resistance in the DUT 150. Voltage or current sweeps may be applied to the DUT 150 where the current $I_D$ in the DUT 150 is regulated to by the supply switch 204 to be at a selected constant level for a time period sufficient to measure the voltage $V_D$ at the DUT 150. The next voltage and/or current level in the sweep is then applied on the DUT 150 for the next measurement until the sweep is completed. It is noted that in either the narrow pulse voltage mode, or in the constant current source mode, the collector supply 202 and supply switch 204 may be configured to perform any desired measurement consistent with the corresponding mode.

The collector supply 202 in FIG. 2 generates a plurality of supply signal pulses with selected voltage or current levels. The supply signal pulses have a supply signal pulse width at a high current capacity. The collector supply 202 outputs the supply signal pulses at a collector supply source terminal 214a when the DUT 150 is connected to form a current path between the collector supply source terminal 214a and a collector supply common terminal 214b. The collector supply 202 in FIG. 2 includes a current source 220 that generates current up to a peak current rating.

A current source capacitor $C_{CS}$ is connected across the current source 220 to enable the current source 220 to charge the current source capacitor $C_{CS}$, and to supply a collector supply current to the current path. The current source capacitor $C_{CS}$ is sized to have a capacitance that enables the collector supply 202 to have a high current capacity that is higher than the peak current rating of the current source 220.

The collector supply 202 also includes a supply voltage generator 224 to generate a plurality of variable voltage pulses having the supply signal pulse width and selected voltage levels on the collector supply source terminal 214a. The supply voltage generator 224 may be controlled by the controller 250 to generate a selectable voltage level and a selectable pulse width. The voltage levels and the supply signal pulse width may be determined by the controller 250 in accordance with the needs of the particular mode of operation and any preset user-selectable parameters (e.g. compliance or limit levels, or any other parameters).

The collector supply 202 includes a buffer amplifier 226 configured to receive the variable voltage pulses from the supply voltage generator 224 and generate the pulses with the current capacity of the current source capacitor $C_{CS}$. The buffer amplifier 226 is powered by the current source capacitor $C_{CS}$ to provide substantially all of the collector supply current from the current source capacitor $C_{CS}$ at the collector supply source terminal 214a. The collector supply 202 is thus configured to operate at the high current capacity provided by the current source capacitor $C_{CS}$ that is higher than the peak current rating of the current source 202.

The supply switch 204 is controlled by a supply switch driver 216 configured to generate switch trigger pulses having a narrow pulse width. The supply switch 204 is connected to the collector supply source terminal 214a. The supply switch driver 216 triggers the supply switch 204 to close and open the current path in a narrow pulse width narrower than the supply signal pulse width to conduct the plurality of supply signal pulses as a plurality of narrowed sweep signal pulses having the high current capacity of the collector supply current.

In the narrow pulse voltage mode, the first DUT port 132 is configured to connect to the supply switch 204 via the current meter 206. The second DUT port 134 is configured to connect to the collector supply common terminal 214b, where the plurality of narrowed supply signal pulses are applied to the DUT 150 when the DUT 150 is connected to the first and second DUT ports 132, 134. The voltage meter 208 is configured to measure a DUT voltage $V_D$ across the DUT 150 within the narrow pulse width of the narrowed sweep signal pulses when the plurality of sweep signal pulses at the DUT 150 are the plurality of narrow sweep signal pulses. The current meter 206 is configured to measure a DUT current $I_D$ through the DUT 150 within the narrow pulse width of the narrowed sweep signal pulses when the plurality of sweep signal pulses at the DUT 150 are the plurality of narrow sweep signal pulses. A gate signal generator 210 is configured to generate a gate signal at a gate DUT port 136 to provide the gate signal to the DUT 150 when the DUT 150 is a three-terminal device with a terminal connected to the gate DUT port 136.

The controller 250 in FIG. 2 is configured to control the device analyzer 200 in a narrow pulse voltage mode or in a constant current source mode controlling the current source 220, the supply voltage generator 224, and the supply switch driver 216 to generate the plurality of narrowed sweep signal pulses at varying voltage or current. The gate signal generator 210 is configured to generate gate signals having different voltages in order to provide sweeps of narrowed sweep signal pulses for the different voltages of the gate signal.

When the controller 250 switches the high current trace module 200 to operate in the constant current source mode by configuring the supply switch 204 to regulate the current level in the current loop to remain at a set value regardless of the resistance of other devices in the current loop. The supply switch driver 216 is controlled to regulate the current level through the supply switch 204 at a selected level and adjusting the current level to other current levels required in the current sweep. The supply voltage generator 224 is controlled to generate a plurality of variable voltages during the current sweep in the constant current source mode, or a plurality of voltage pulses at about the same voltage level according to the requirements of a specific test protocol or measurement. A DUT voltage $V_D$ and a DUT current $I_D$ is measured at each of the plurality of voltages or current levels. Depending on the test protocol or measurement being performed, the DUT characteristics of the DUT may be determined, such DUT characteristics including the DUT resistance values for the measured DUT voltages and currents.

The current meter 206 in FIG. 2 comprises a variable output resistor $R_{out}$ connected at the inputs of a current meter differential amplifier 230, and a first voltmeter 232. The output of the current meter differential amplifier 230, $V_m$, is indicative of a voltage drop across the variable output resistor $R_{out}$. The voltage, $V_m$, is measured by the voltmeter 232 and used to determine the current $I_D$ through the known value of the variable output resistor $R_{out}$.

The voltage meter 208 includes a voltage meter differential amplifier 240 with inputs connected across the DUT 150, and a second voltmeter 236. The output voltage, $V_m$, of the voltage meter differential amplifier 240 is indicative of the voltage across the DUT 150. By applying the voltage, $V_m$, to the voltmeter 236, a measure of the voltage drop across the DUT 150 may be determined.

Figure 3:
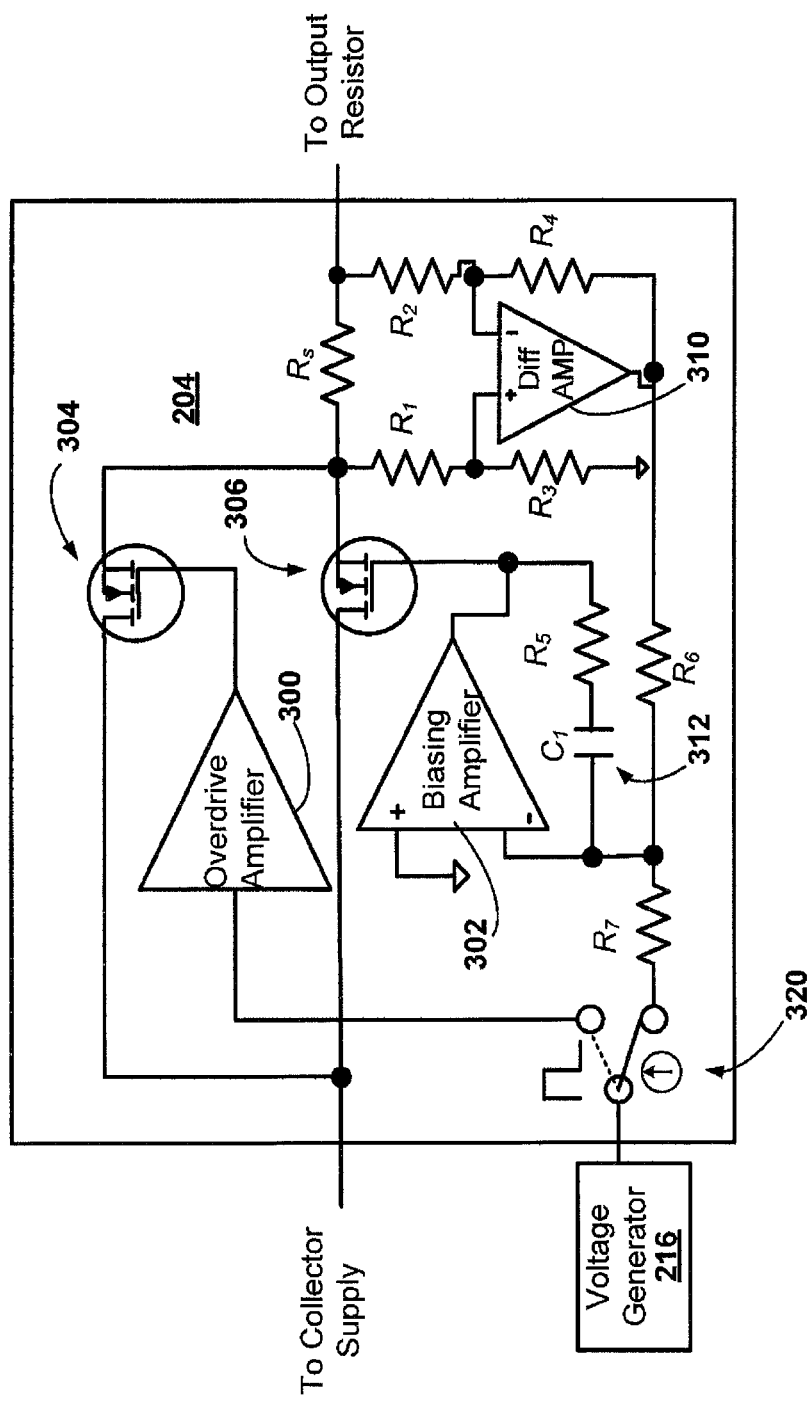
FIG. 3 is a schematic diagram of an example of a supply switch that may be used in the high-current curve trace module in FIG. 2.

The high current curve trace module 200 in FIG. 2 may operate in either the narrow pulse voltage mode or the constant current source mode as determined by the controller 250. The dual modes of operation are largely dependent on the operation of the supply switch 204. FIG. 3 is a schematic diagram of an example of a supply switch 204 that may be used in the high-current curve trace module in FIG. 2. The supply switch 204 shown in FIG. 3 includes an overdrive amplifier 300, a biasing amplifier 302, a switching element 304, a regulating element 306, and a supply switch differential amplifier 310. The supply switch 204 includes a mode switch 320 that may be controlled by the controller 250 to switch the trigger signal received from the supply switch driver 216 between providing a narrow pulse in the narrow pulse voltage mode and a voltage level in the constant current source mode. As shown in FIG. 3, the narrow pulse voltage mode is selected when the mode switch 320 is in the position indicated by the dotted line. The constant current source mode is selected when the mode switch 320 is in the position indicated by the solid line.

A constant current sense resistor $R_{ss}$ is connected at the inputs of the supply switch differential amplifier 310. An RC branch 312 is connected as feedback for the biasing amplifier 302. Resistors $R_1$, $R_2$, $R_3$, $R_4$ are connected to support the current sensing function of the supply switch differential amplifier 310. The resistor $R_5$ and the capacitor $C_1$ in the RC branch 312 connect with resistors R6 and R7 and with the biasing amplifier 302 to apply a biasing voltage at the gate of the regulating element 306. The output of the supply switch differential amplifier 310 is indicative of the current sensed through the constant current sense resistor $R_{ss}$. The output of the supply switch differential amplifier 310 and the voltage level from the supply switch driver 216 are applied to the feedback network formed by the RC branch 312 and resistors $R_6$ and $R_7$ to drive the biasing amplifier 302 to generate the biasing voltage. The generated biasing voltage controls the regulating element 306 to regulate the current level through the DUT 150 at a constant level.

When the mode switch 320 selects the narrow pulse voltage mode, the pulsed voltage generated by the supply switch driver 216 is buffered by the overdrive amplifier 300 to generate a pulse with a voltage level sufficient to trigger the switching element 304 to close for the period of the narrow pulse width of the pulsed voltage. The pulse width may be adjusted by the controller 250.

A. Multi-Function Unit

Figure 4:
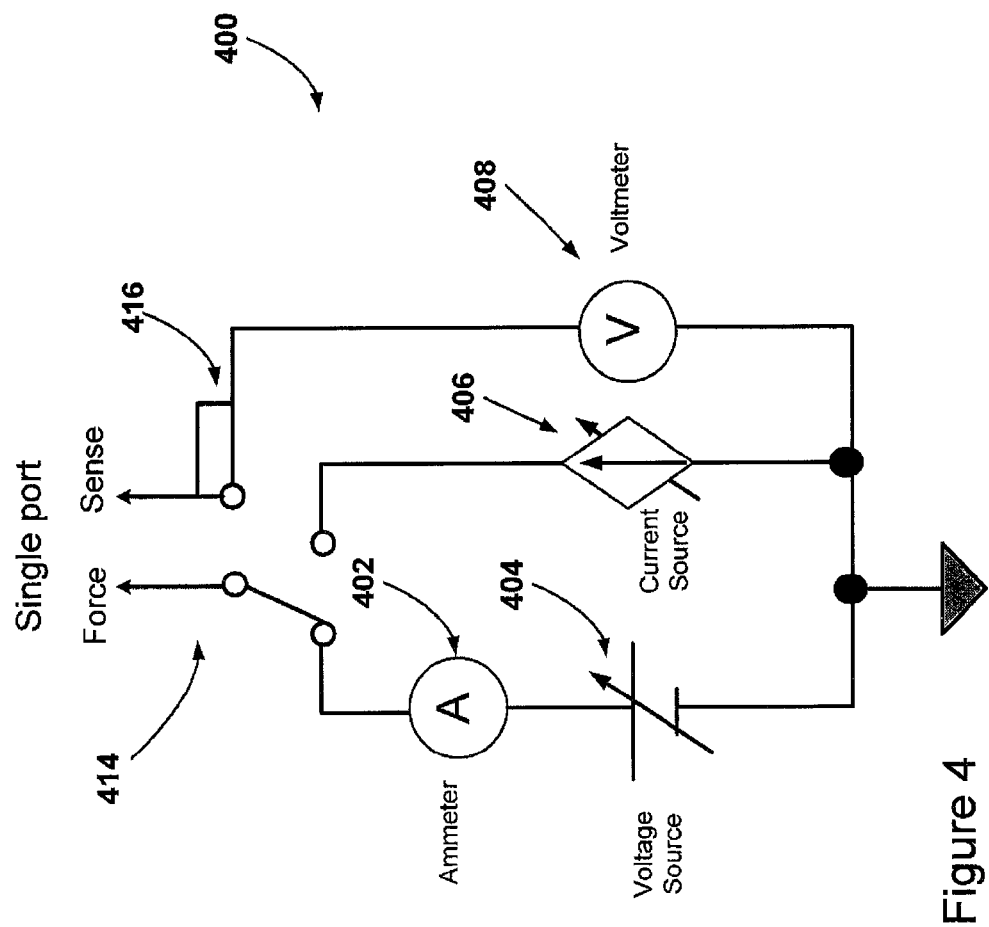
FIG. 4 is a schematic diagram of an example of a multi-function unit that may be used in device analyzers.

FIG. 4 is a schematic diagram of an example of a multi-function unit that may be used for selected functions in the device analyzer 100 in FIG. 1. The multi-function unit 400 in FIG. 4 includes a variable pulsed current source component 406, a variable pulsed voltage source component 404, a current meter component 402, and a voltage meter component 408. The multi-function unit 400 in FIG. 4 is illustrated schematically. Not illustrated are input and output signals that may be used to control operation of each of the components 402, 404, 406, and 408 as well as to obtain information that may be provided particularly by the current meter component 402 and the voltage meter component 408.

The controller 250 in FIG. 2, for example, may generate control signals that configure the variable pulsed voltage source component 404 to generate voltage signals having a selected voltage level and a selected pulse width. The selected pulse width may be set to infinity to provide a non-pulsed, DC voltage output. The variable pulsed current source component 406 may be configured with control signals to generate selected current levels in pulses having a selected pulse width.

The multi-function unit 400 may also include a processing element to enable more complex operation of the components 402, 404, 406, and 408. For example, the variable pulsed voltage source component 404 may be configured to generate a series of pulses having levels within a predetermined range for a predetermined time period. Alternatively, each pulse may be generated under control of the controller 250.

The multi-function unit 400 in FIG. 4 generally includes the primary functional components that are used in typical curve tracers. The multi-function unit 400 may also be used as to perform the specific functions of the components in the high current curve trace module 200 in FIG. 2. For example, where the supply voltage generator in FIG. 2 may be implemented using the multi-function unit 400 and configuring the variable pulsed voltage source component 404 to operate accordingly. The supply switch driver 224 may also be similarly implemented using the variable pulsed voltage source component 404 or the variable pulsed current source component 406 in a second multi-function unit. Referring to FIG. 2, a first multi-function unit 260 may be configured to perform both the functions of the supply voltage generator 224 and the second voltmeter 236. Similarly, a second multi-function unit 262 may be configured to perform both the functions of the supply switch driver 216 and the first voltmeter 232.

B. Example Results

Figure 5A:
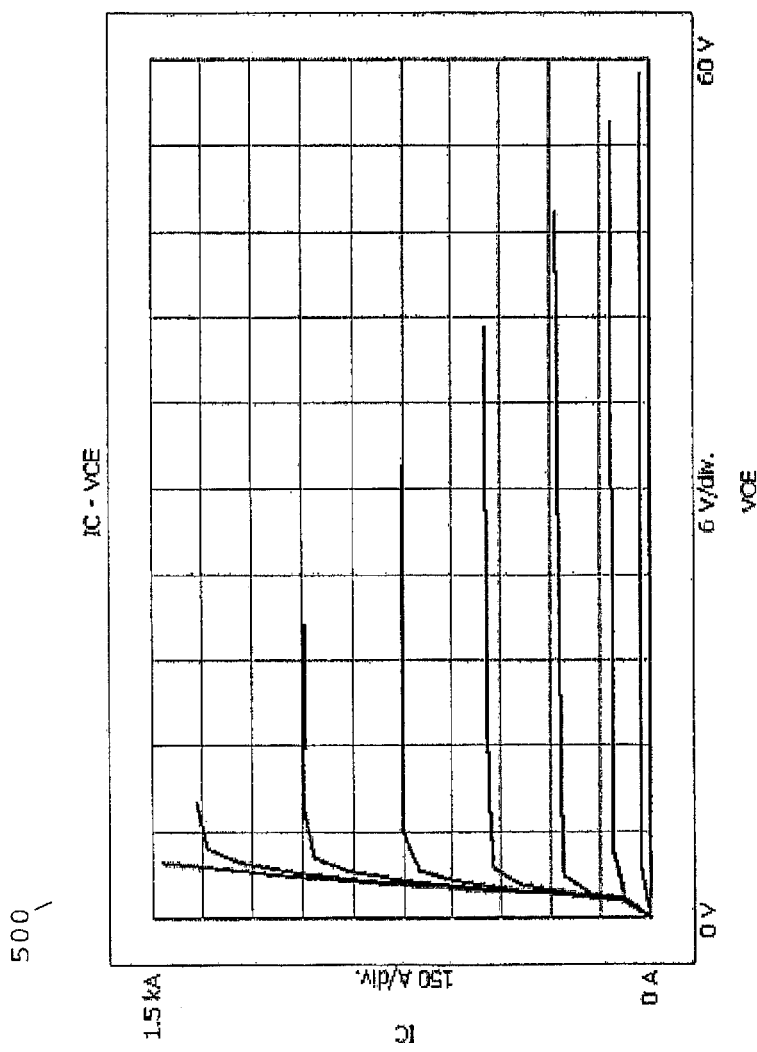
FIG. 5A is a graph depicting an example of an I-V curve trace generated by an implementation of the high-current curve trace module in FIG. 2 operating in a narrow pulse voltage mode.
Figure 5B:
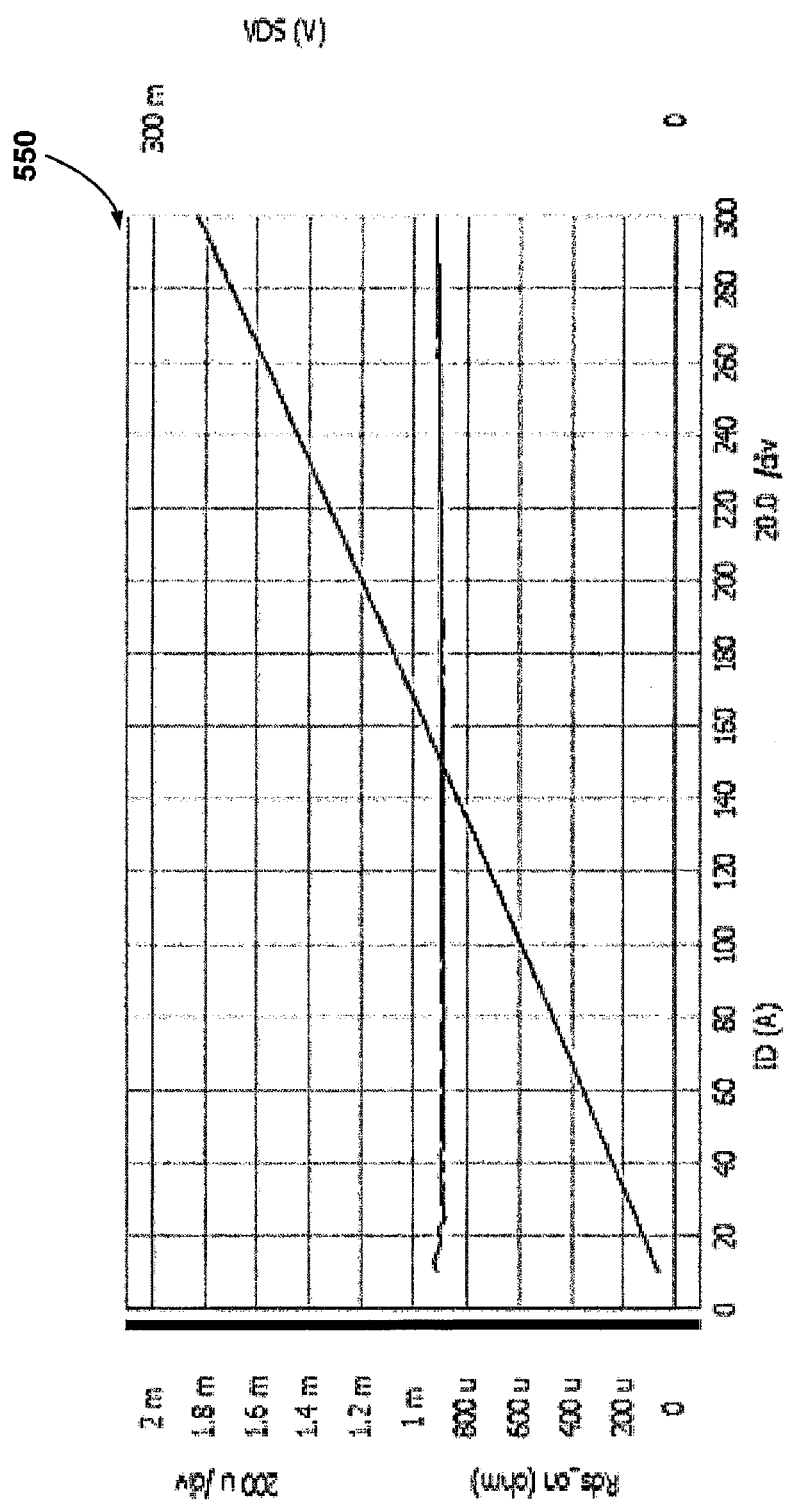
FIG. 5B is a graph depicting an example of a drain resistance measurement of a DUT generated by an implementation of the high-current curve trace module in FIG. 2 operating in a constant current source mode.

FIG. 5A is a graph depicting an example of an I-V curve trace 500 generated by an implementation of the high-current curve trace module 200 in FIG. 2 operating in a narrow pulse voltage mode. The I-V curve trace 500 depicts Ic-VCE characteristics for an IGBT device. FIG. 5B is a graph depicting an example of a drain resistance measurement 550 of a LDMOS device generated by an example implementation of the high-current curve trace module 200 in FIG. 2 operating in a constant current source mode. The example implementation of the high-current curve trace module 200 is capable of a peak current from the collector supply 202 of up to 1500 A, a peak power of up to 22.5 kW, an output open voltage (voltage at DUT ports when no DUT is present) of up to 60V, and a controllable pulse width from 10 µs to 1 ms, with 2 µs resolution. The collector supply 202 is also capable of operating in a voltage pulse, or a current pulse mode. It is to be understood by those of ordinary skill in the art that other types of measurements may be performed using the high-current curve trace module 200 in FIG. 2 operating in either the narrow pulse voltage mode or the constant current source mode.

III. High-Voltage Medium-Current Curve Trace Module

Figure 6:
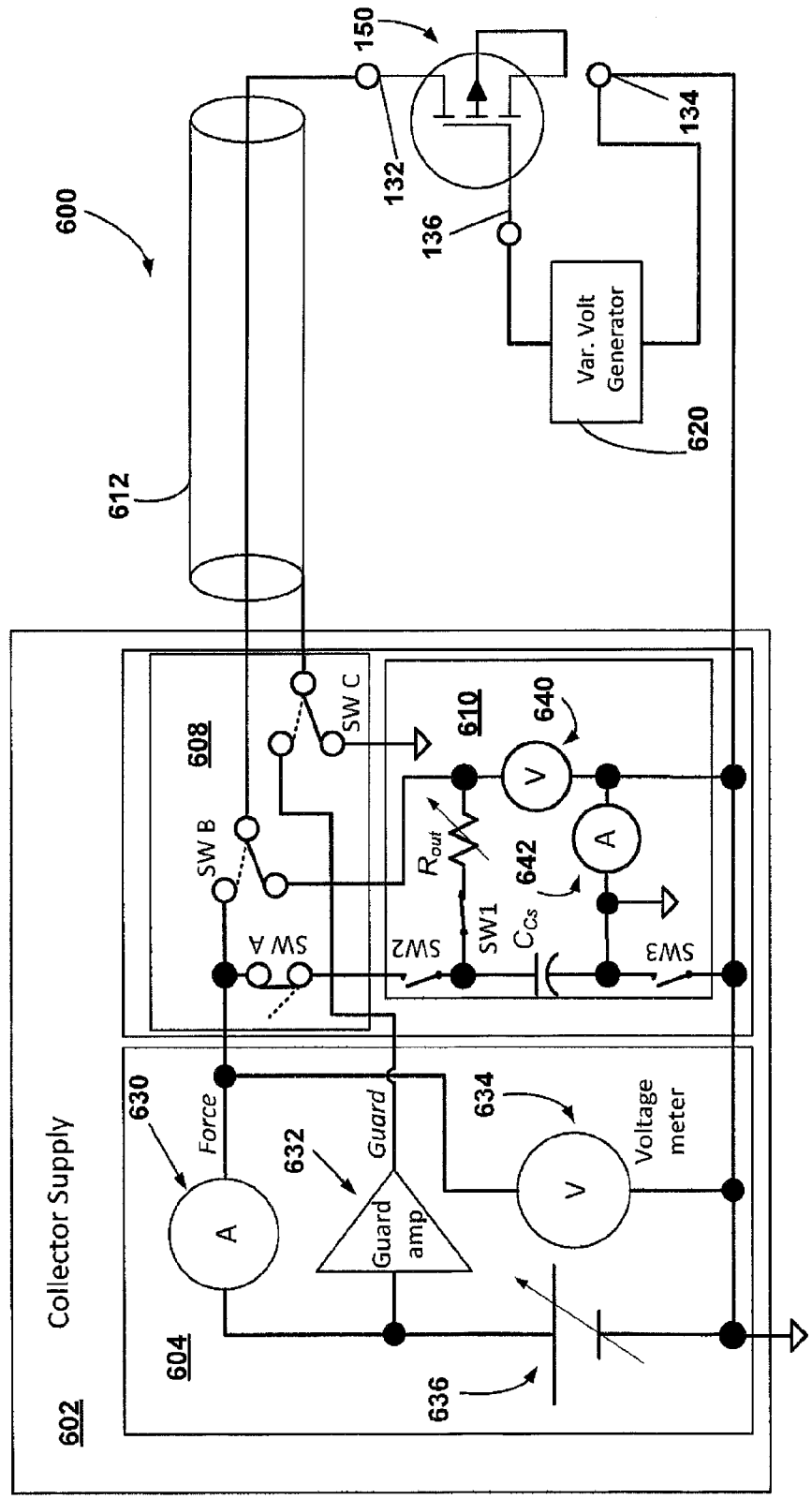
FIG. 6 is a schematic diagram of an example of a high-voltage medium-current curve trace module.

FIG. 6 is a schematic diagram of an example of a high-voltage medium-current curve trace module 600. The high-voltage medium-current curve trace module 600 in FIG. 6 includes a high-voltage medium current ("HVMC") collector supply 602, a second gate signal generator 620, a second voltage meter 640, and a second current meter 642. The first, second, and third DUT ports 132, 134, 136 are switched to connect to the high-voltage, medium current trace module 600.

The HVMC collector supply 602 is configured to operate as a high-voltage DC supply for analyzing the DUT 150 at voltage levels of the DUT 150 greater than a breakdown voltage. The HVMC collector supply 602 is also configured to operate as a variable voltage and narrow pulse supply for analyzing I-V characteristics of the DUT 150. The HVMC collector supply 602 is switchable between operation as the high-voltage DC supply and the variable voltage and narrow pulse supply, by a switching mechanism including a processor controlled mechanism, or a manual, user controlled mechanism, or any other suitable switching mechanism.

The HVMC collector supply 602 comprises a variable voltage power supply 604 with a peak current rating, supply switch component 608, and a current expander component 610. The variable voltage power supply 604 includes a power supply current meter 630, a guard amplifier 632, a power supply voltmeter 634, and a variable DC supply 636. The variable voltage power supply 604 may be implemented using a version of the multi-function unit 400 in FIG. 4 having a high peak power rating. The variable voltage power supply 604 is described herein as implemented using a high-power version of the multi-function unit 400 in FIG. 4. For example, in one implementation, the variable voltage power supply 604 may be implemented using the collector supply component identified below as the "high-voltage collector supply 902," which is described below with reference to FIG. 9. However, it is to be understood by those of ordinary skill in the art that the variable voltage power supply 604 may be implemented using a variable DC supply, guard amplifier, current meter, and voltage meter provided as independent components.

An example implementation of a high power multi-function unit may be implemented to operate as the variable voltage power supply 604 in FIG. 6 by adding the guard amplifier 632 with a guard amplifier input connected to the variable DC supply 636, which may be implemented using the variable voltage component of the multi-function unit. The guard amplifier 632 may be configured as a guard output of the variable voltage power supply 604 or the high power multi-function unit. The power supply current meter 630 may be implemented using the current meter in the high power multi-function unit in serial between the variable voltage power supply 636 and the force terminal of the high power multi-function unit. The power supply voltmeter 634 may be implemented using the voltmeter component in the high power multi-function unit being used as the variable voltage power supply 604.

The variable DC supply 636 provides power for the HVMC collector supply 602 when the high voltage medium current curve tracer module 600 is operating as a high-voltage DC supply. The current level is measured using the power supply current meter 630, and the voltage across the DUT 150 is measured using the power supply voltage meter 634. The guard amplifier 632 connects to a guard shield 612 when the HVMC collector supply operates as the high-voltage DC supply, and the power is applied directly to the DUT 150.

The current expander component 610 comprises a current source capacitor $C_{CS}$ connected across the high-voltage pulsed power supply 604. The current source capacitor $C_{CS}$ receives a current from the variable voltage power supply 604 to charge the current source capacitor $C_{CS}$ to generate current at a high current capacity that is higher than the peak current rating of the variable voltage power supply 604.

The current expander component 610 includes a first and a second charging switches SW2, SW3 connected between the variable voltage power supply 604 and the current source capacitor $C_{CS}$. The first and second charging switches SW2, SW3 selectively charge the current source capacitor $C_{CS}$ when closed, and they float the current source capacitor $C_{CS}$ when the first and second charging switches SW2, SW3 are opened. A sweep signal switch SW1 is connected to the first lead of the current source capacitor $C_{CS}$ and the sweep signal switch SW1 is configured to generate a sweep signal pulse at the DUT 150 via a variable output resistor when the sweep signal switch SW1 is closed.

The supply switch component 608 selectively switches the variable voltage power supply 604 to connect to either the current expander component 610 to operate the HVMC collector supply 602 as a variable voltage and narrow pulse supply, or directly to the DUT 150 to operate as a non-pulsed voltage supply. When connected to the DUT 150, the guard amplifier 632 output to the guard output of the variable voltage power supply 604 is switched to connect to the guard shield 612 when the HVMC collector supply 602 is configured to operate as the high-voltage DC supply. The guard shield 612 operates to permit the power supply current meter 630 to measure current down to the pico-ampere level.

The supply switch component 608 in FIG. 6 includes switches SWA, SWB, and SWC. In the state indicated by dotted lines at switches SWA, SWB, and SWC the HVMC collector supply 602 operates in the high-voltage DC supply mode to provide a high-voltage DC signal to the DUT 150. Switch SWA is open to disconnect the current expander component 610 from the variable voltage power supply 604. Switch SWB is set at the dotted line to connect the variable voltage power supply 604 to a cable in the guard shield 612 that connects directly to the DUT 150. Switch SWC is set at the dotted line setting to connect the guard amplifier 632 to the guard shield 612. The settings of switches SWA, SWB, and SWC at the solid setting connect the current expander component 610 to the variable voltage power supply 604 and to the DUT 150 to operate as described below with reference to FIG. 7A.

The second gate signal generator 620 is configured to generate a gate signal to the DUT when the DUT is a three-terminal device. The second voltage meter 640 is configured to measure a voltage across the DUT 150. The second current meter 642 is configured to measure a current level through the DUT 150. The second voltage meter 640 and the second current meter 642 measure voltage and current at the DUT 150 when the HVMC collector supply 602 is configured to operate as the variable voltage and narrow pulse supply.

It is noted that a controller may be included in the high voltage medium current curve trace module 600 in FIG. 6 similar to the controller 250 shown in the high current curve trace module 200 in FIG. 2. While not shown in FIG. 6, the description below may make reference to a controller, which shall be understood to be implemented in a manner similar to the controller 250 in FIG. 2.

Figure 7A:
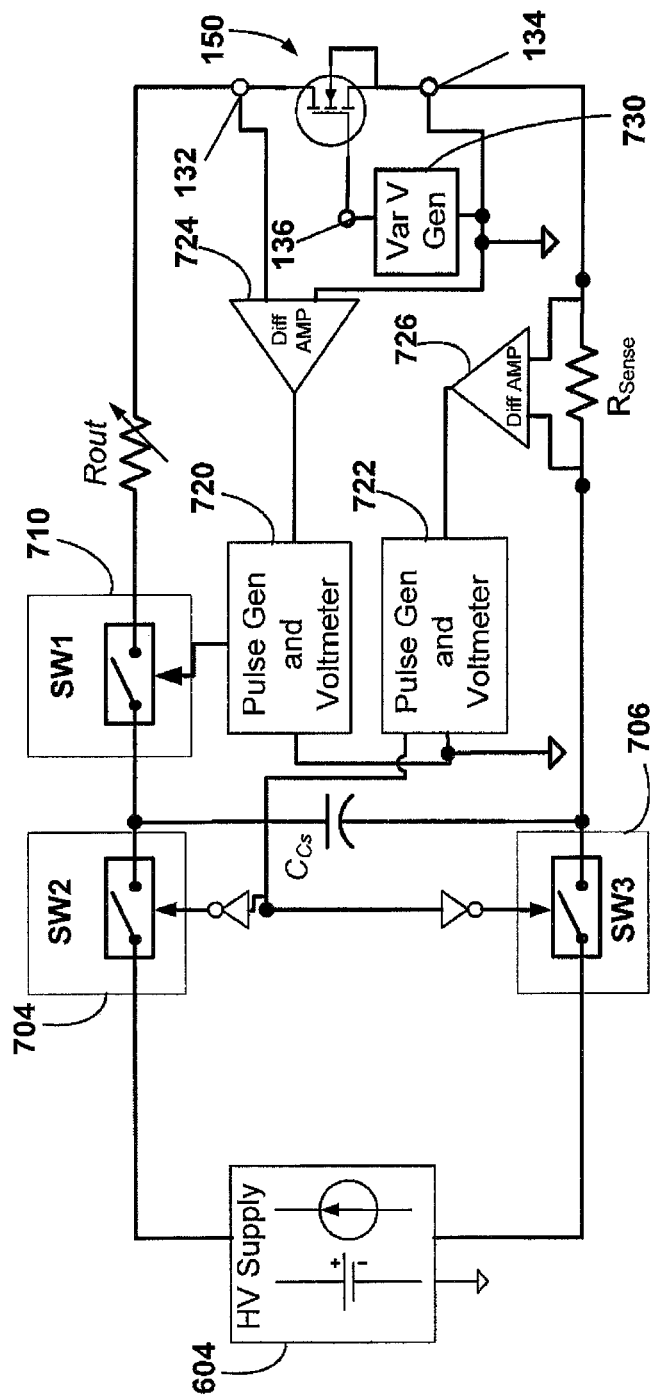
FIG. 7A is a schematic diagram of the high-voltage medium-current curve trace module in FIG. 6 operating in a variable voltage narrow pulse mode.

FIG. 7A is a schematic diagram of the high-voltage medium-current curve trace module in FIG. 6 operating in a variable voltage narrow pulse mode 700. The high-voltage medium current curve trace module in FIG. 7A describes operation in the variable voltage narrow pulse mode where the settings of switches SWA, SWB, and SWC are at the solid setting shown in FIG. 6. The high-voltage medium curve trace module in the variable voltage narrow pulse mode 700 includes the variable voltage power supply 604, first and second charging switches 704 and 706, the current source capacitor $C_{CS}$, a sweep signal switch 710, a variable output resistor $R_{out}$, a sweep signal switch driver 720, a charging switch driver 722, a voltmeter differential amplifier 724, and a current meter differential amplifier 726.

The voltmeter differential amplifier 724 includes inputs connected across the DUT 150. The current meter differential amplifier 726 includes inputs connected across a current sense resistor $R_{sense}$ connected in series with the DUT 150. The sweep signal switch driver 720 and the charging switch driver 722 may be implemented using a multi-function unit similar to the multi-function unit 400 described above with reference to FIG. 4. The variable voltage source component of the multi-function unit implemented to operate as the sweep signal switch driver 720 may be configured to provide control signals to open and close the sweep signal switch 710 for a time period corresponding to a selected narrow pulse width. The same multi-function unit used for the sweep signal switch driver 720 may be configured to measure the output voltage of the voltmeter differential amplifier 724 thereby providing the second voltmeter 640 in FIG. 6. Similarly, the charging switch driver 722 may be the variable voltage source component of another multi-function unit configured to generate pulses that open or close the charging switches 704, 706. The voltmeter component of the multi-function unit may be configured to measure the output voltage of the current meter differential amplifier 726 to determine the current through the DUT 750 based on the known resistance of the current sense resistor $R_{sense}$.

In the variable voltage narrow pulse mode, the first and second charging switches 704, 706 are closed for a time sufficient to charge the current source capacitor $C_{CS}$. The first and second charging switches 704, 706 are then opened to float the current source capacitor $C_{CS}$ before the sweep signal switch 710 is closed to generate pulses using the current source capacitor $C_{CS}$ as the power source for the pulses.

Figure 7B:
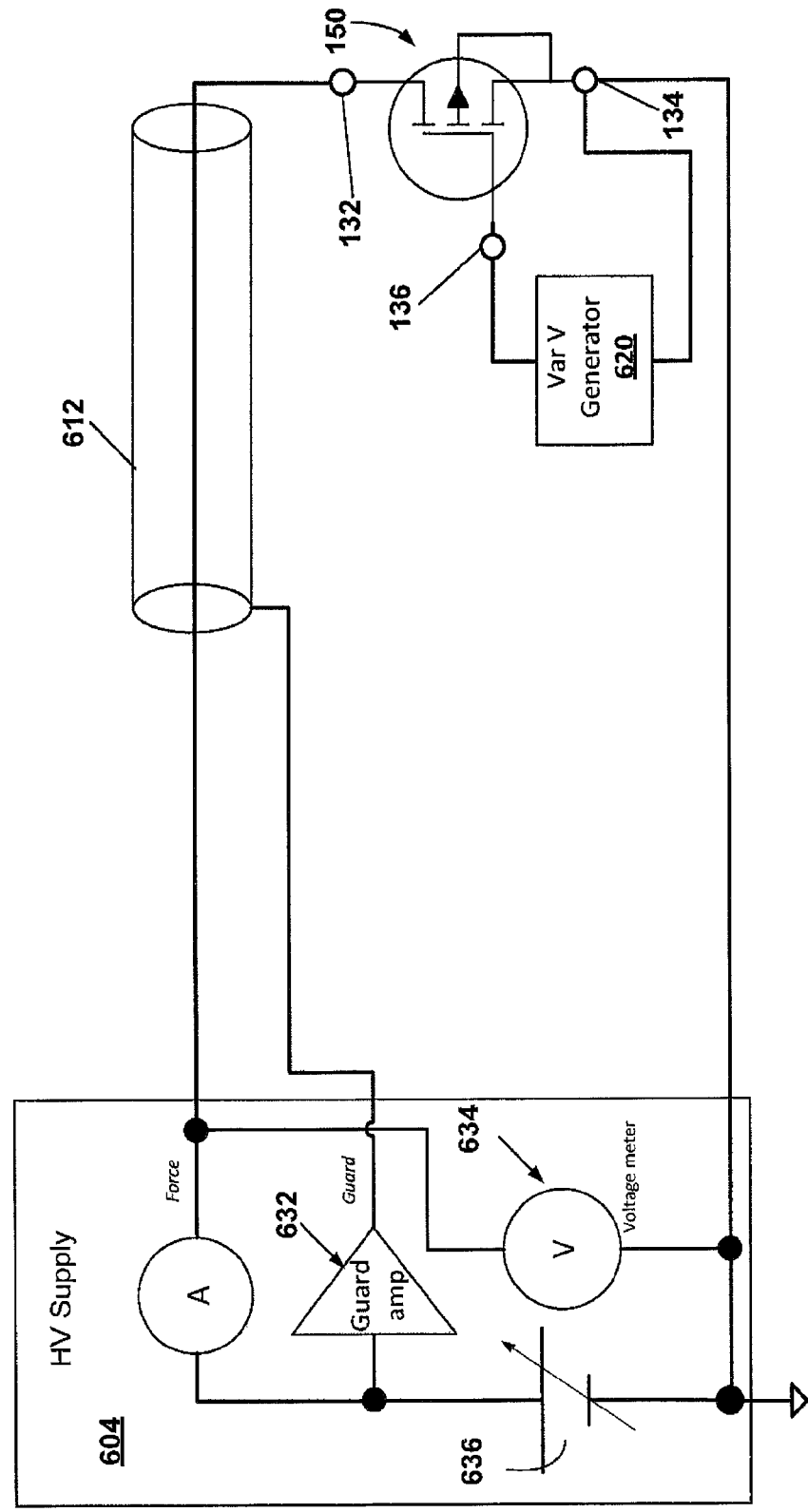
FIG. 7B is a schematic diagram of the high-voltage medium-current curve trace module in FIG. 6 operating in a high-voltage DC supply mode.

FIG. 7B is a schematic diagram of the high-voltage medium-current curve trace module in FIG. 6 operating in a high-voltage DC supply mode. The diagram of the high-voltage medium current curve trace module in FIG. 7B depicts the variable voltage power supply 604 connected directly to the DUT 150 with the guard amplifier 632 connected to the guard shield 612. In the high-voltage DC supply mode, the high-voltage medium current curve trace module may be used to apply a high voltage to the DUT 150 that is at or near the breakdown voltage of the DUT 150. The current through the DUT 150 at or near the breakdown voltage may be analyzed down to the pico-ampere level.

Figure 8:
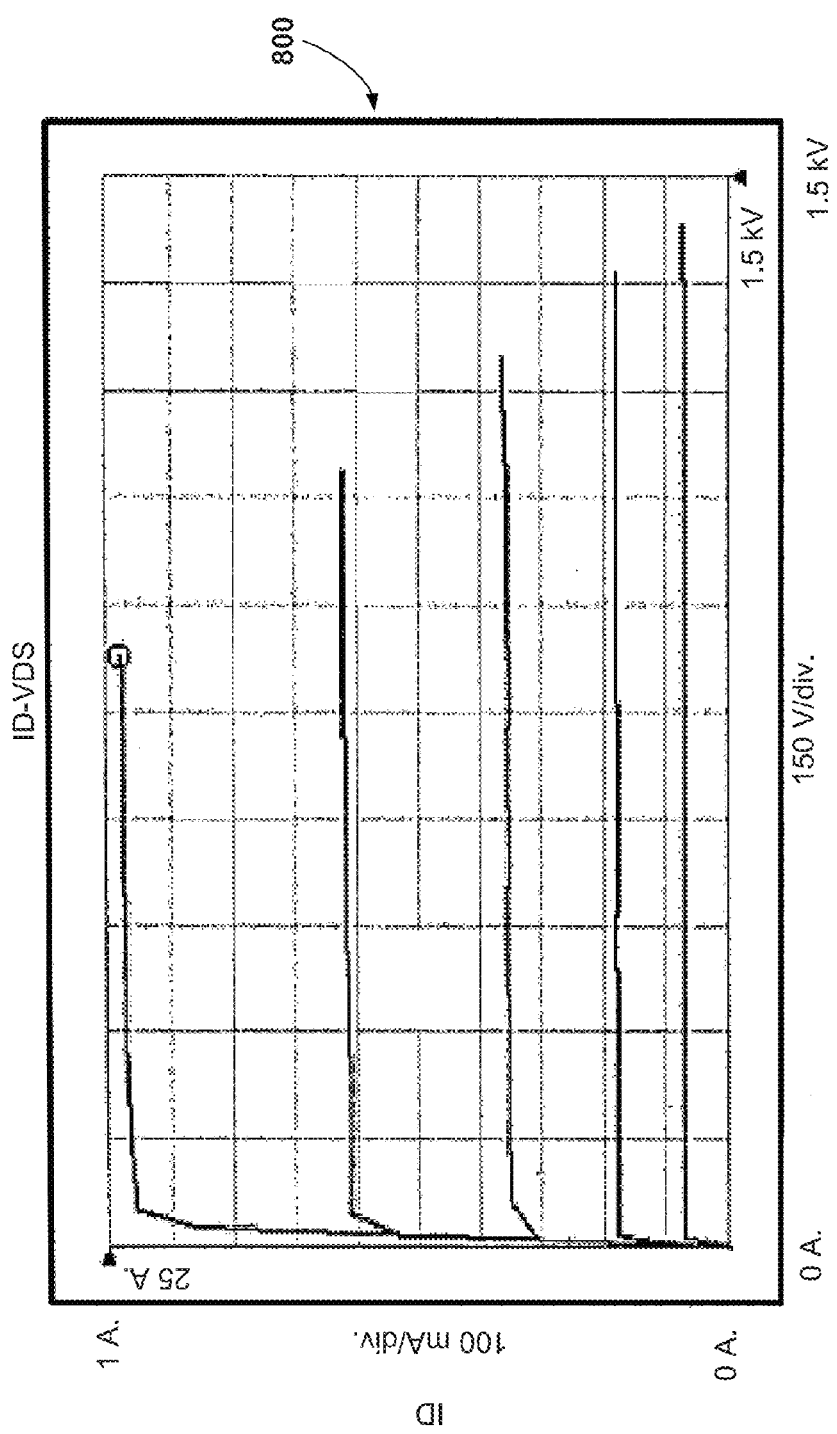
FIG. 8 is a graph depicting an example of an I-V curve trace generated by an implementation of the high-voltage medium-current curve trace module in FIG. 6 operating in the variable voltage narrow pulse mode.

FIG. 8 is a graph depicting an example of an I-V curve trace 800 generated by an implementation of the high-voltage medium-current curve trace module in FIG. 6 operating in the variable voltage narrow pulse mode. As indicated in the I-V curve trace 800 in FIG. 8, the DUT 150 may be tested at high voltages (as high as 1.5 kV, or in an example implementation, 2.0 kV). By applying the high voltage pulses and medium current levels in narrow pulses, the DUT 150 is protected from damage from self-heating. In addition, by switching the high voltage medium curve trace module to the high DC supply mode, the DUT 150 may be analyzed at or near breakdown voltage levels without requiring a substantial and/or time-consuming change to the test environment of the DUT 150.

IV. High-Voltage Curve Trace Module

Figure 9:
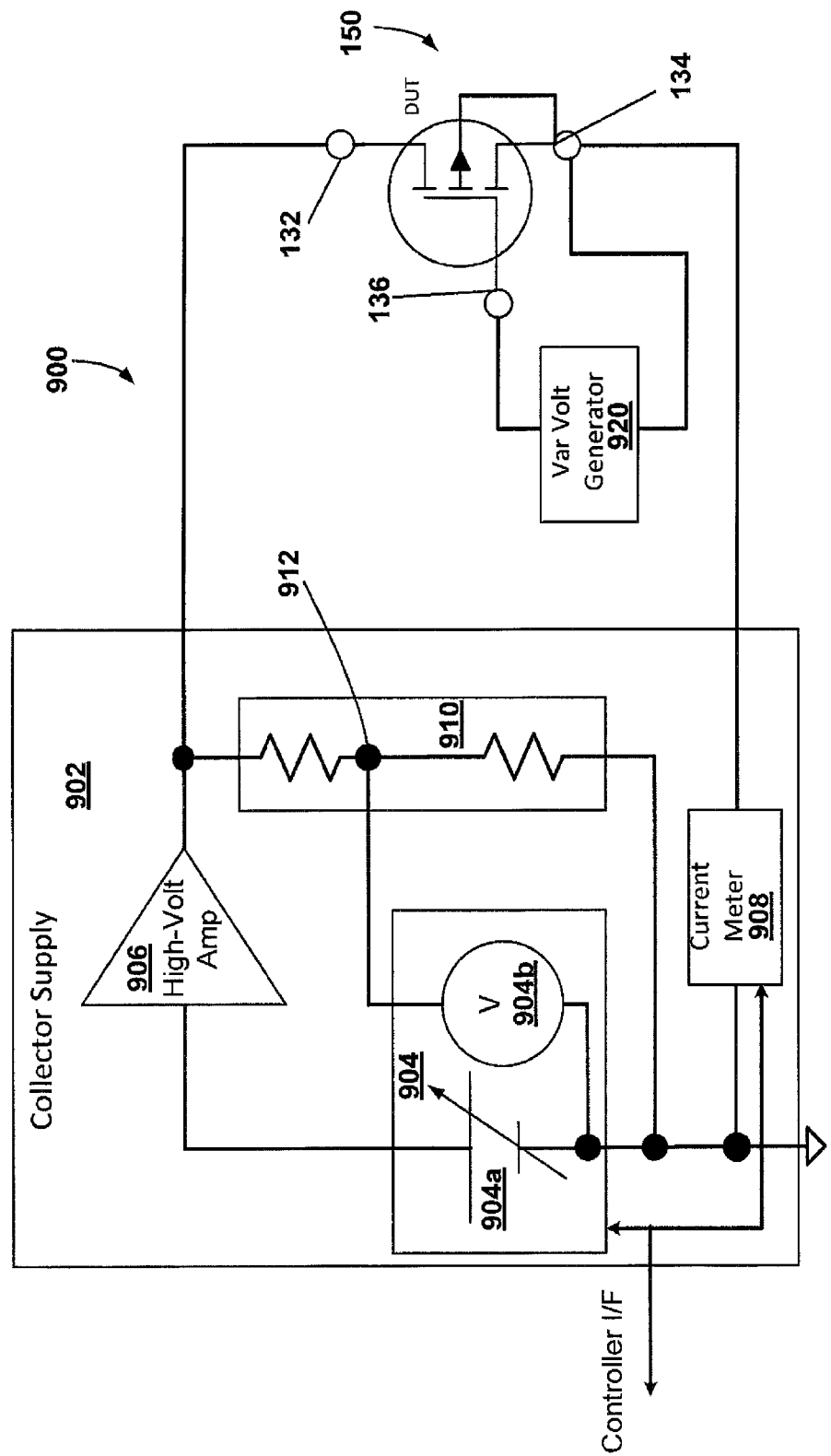
FIG. 9 is a schematic diagram of an example of a high-voltage curve trace module.

FIG. 9 is a schematic diagram of an example of a high-voltage curve trace module 900. The high-voltage curve trace module 900 includes a high-voltage collector supply 902, a high-voltage multi-function unit 904 that includes a variable pulsed voltage source component 904*a* and a voltage meter component 904*b*. The high-voltage multi-function unit 904 is configured to operate as a pulsed power supply with a peak voltage rating. The high-voltage multi-function unit 904 also includes a high-voltage amplifier 906 connected to amplify a voltage generated by the high-voltage multi-function unit 904. The high-voltage amplifier 906 generates a voltage sweep signal having a variable voltage level ranging from a low level to a high level greater than the peak voltage rating of the high-voltage multi-function unit 904, and a pulse width determined by the high-voltage multi-function unit 904. The high-voltage multi-function unit 904 may be controlled by a controller configured in a manner similar to the controller 250 shown in FIG. 2 to generate pulses at a selected pulse width and voltage level, which is amplified according to a gain of the high-voltage amplifier 906.

It is noted that the high-voltage multi-function unit 904 is described herein as implemented using a high-power version of the multi-function unit 400 in FIG. 4. However, it is to be understood by those of ordinary skill in the art that the high-voltage multi-function unit 904 may be implemented using a variable DC supply and voltage meter provided as independent components.

The high-voltage collector supply 902 further includes a current meter 908 and a voltage divider 910. The voltage divider 910 is connected to an output of the high-voltage amplifier 902 at one end of the voltage divider 910 and to the high-voltage multi-function unit 904 at an opposite end of the voltage divider 910. The voltage divider 910 includes a divided voltage node 912 connected to the voltage meter component 904*b* of the high-voltage multi-function unit 904.

The current meter 908 is connected in series with the DUT 150 and is configured to measure current down to a pico-ampere level. A guard amplifier and guard shield may be added to assist in measuring current to as low a level as possible. The first and second DUT ports 132, 134 are switched to connect to the high-voltage curve trace module 900 at the output of the high-voltage amplifier and the third current meter, respectively. The voltage meter component 904*b* in the high-voltage multi-function unit 904 measures the voltage at the DUT 150 and the third current meter 908 measures the current through the DUT 150 as the high-voltage amplifier output level is varied.

FIG. 9 shows a gate signal generator 920 to apply a gate signal to the gate terminal of the DUT 150 when the DUT 150 is a three-terminal device. As such, FIG. 9 illustrates that the high-voltage curve trace module 900 may be implemented to generate standard I-V curve traces. In a manufacturing or development environment, the DUT 150 may be subject to testing to determine static characteristics, but then efficiently switched to subject the DUT 150 to high-voltage testing to determine breakdown characteristics and other behavior at high voltages without having to use a different test environment.

Figure 10:
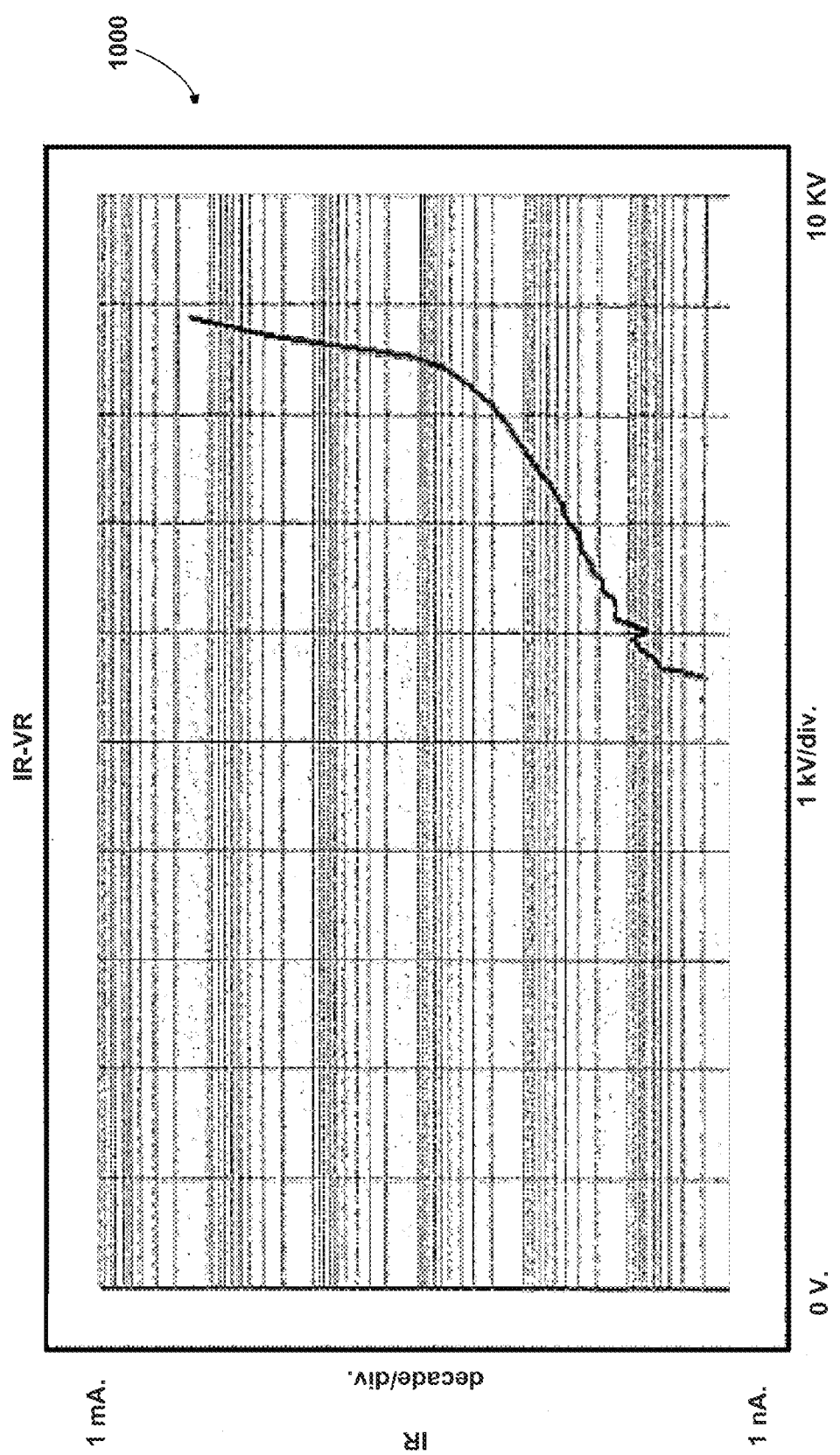
FIG. 10 is a graph depicting an example of a high-voltage and current measurement generated by an implementation of the high-voltage curve trace module in FIG. 9.

FIG. 10 is a graph depicting an example of a high-voltage and current measurement 1000 generated by an implementation of the high-voltage curve trace module 900 in FIG. 9. The DUT 150 tested in the high-voltage and current measurement 1000 in FIG. 10 is a diode tested in reverse bias to determine the diode's breakdown voltage. In an example process for generating the high-voltage and current measurement 1000 in FIG. 10, the diode may be connected to the first and second DUT ports 132, 134 in FIG. 9 so that the voltage from the high-voltage collector supply 902 is applied to the diode in reverse bias. a sweep of pulses at voltage levels from a low voltage to voltages as high as 10 kV may be applied to the DUT 150. As the voltage level increases, the current measurements at very low current levels can determine precisely where the breakdown of the junction begins to occur. Further measurement and increased voltage levels provides an informative analysis of the behavior of the device as the junction breaks down.

It is to be understood by those of ordinary skill in the art that other types of tests and device analyses may be performed by making advantageous use of the high-voltage and low current measurement capabilities of the high-voltage curve trace module 900.

V. Pulse Waveform Analyzer

Pulsed I-V curve traces permit determination of I-V characteristics while reducing the possibility of destroying the DUT 150 due to self-heating. When pulsed I-V curve traces are generated, measurements are taken during the time period of the pulse of the sweep signals. Pulses however are rarely perfect rises to a level that is stable for a time period before falling to a low level. Typically, the pulse may require some settling time before it is sufficiently stable for taking measurements.

Curve tracers have typically performed pulsed I-V analysis with pulses having a fixed pulse width and measurements were taken within a fixed measurement aperture after a fixed delay to start of measurement. A pulse waveform analyzer is proposed to permit a user to configure pulse waveforms so that measurements are taken during an optimal time in the pulse.

FIG. 11A is a flowchart of an example method for inspecting a pulse waveform analyzer 1100. The pulse waveform analyzer 1100 provides a user with a tool to obtain some control over the pulses, and of the pulse parameters. The pulse waveform analyzer 1100 also provides the user with a tool for analyzing the behavior of the pulses generated in analyzing devices. FIGS. 12A and 12B are graphs illustrating operation of an example of a pulse waveform analyzer. Reference is made to the graphs in FIGS. 12A and 12B in the following description of the pulse waveform analyzer 1100.

The pulse waveform analyzer 1100 may be used in any measurement involving pulses as stimuli. The description of the pulse waveform analyzer 1100 is in the context of I-V curve traces. However, any type of tests involving pulses may advantageously include the pulse waveform analyzer 1100 as a tool. The pulse waveform analyzer 1100 may be implemented as a software component of the device analyzer 100 in FIG. 1, and made available for operation with any curve trace module equipped to perform test measurements involving pulsed test stimuli (e.g. pulsed I-V sweeps). An example implementation of such a software component is described below with reference to FIG. 11B. Alternatively, the software component may be implemented specifically in the software system of individual curve trace modules.

Referring to FIG. 11A, the pulse waveform analyzer 1100 may be initiated for operation at any point of an I-V sweep. At step 1102, the pulsed sweep is performed and the user is given the option to invoke the pulse waveform analyzer 1100. The pulse waveform analyzer 1100 may be invoked by the user through a user interface mechanism (e.g. a button on the screen or on a user interface panel of the device analyzer 100). Alternatively, the user may pre-configure the I-V sweeps such that the pulse waveform analyzer 1100 operates in conjunction with the I-V curve traces.

At step 1104, control is transferred to operation of the pulse waveform analyzer 1100 as a software process. For example, a software process or a command "Inspect Pulse Waveform" may provide the user with access to the features and analytical devices of the pulse waveform analyzer 1100. The I-V curve traces may continue to operate in the background, or the traces may be stopped. Either way, analysis of the pulse waveforms may proceed using stored measurement data.

The user may invoke operation of the pulse waveform analyzer 1100 by selecting a data point on the I-V curve traces. For example, in FIG. 12A, the user may select point 1202 on the I-V curve trace 1200. The selection may be made by defining parameters, such as a time on the time axis and a specific gate voltage level to indicate where on the specific curve trace the desired pulse waveform will be located. In an example implementation, the device analyzer 100 may include GUI tools that permit the user to click or poke the point at which the pulse selected for inspection may be found on the curve traces.

At step 1106, the pulse waveform analyzer 1100 may generate a display of the drain voltage, $V_D$. At step 1108, the drain current, $I_D$, may also be displayed on a waveform monitor 108 (in FIG. 1). Referring to FIGS. 12A and 12B, the drain voltage, $V_D$, and drain current, $I_D$, may be displayed as a graph of the signal levels over time. The y-axis may represent signal level, which is either voltage or current depending on the parameter being displayed. The x-axis may represent time. The signal level graphs may share the y-axis and distinguish the drain voltage, $V_D$, from the drain current, $I_D$, with labels as shown in graph 1200 in FIG. 12A, or by color coding. The signal graphs may also be split to show the pulses individually, and lined up over time as shown in graph 1250 in FIG. 12B.

At step 1110, the pulse waveform analyzer 1100 displays a measurement aperture on the graphs depicting the voltage pulse ($V_D$) and/or the current pulse ($I_D$). As shown in FIGS. 12A and 12B, the measurement aperture is depicted as a window within which a measurement is taken of either the drain voltage ($V_D$), the drain current ($I_D$), or both. The measurement of the indicated parameter ($V_D$ or $I_D$) becomes the value for the corresponding parameter that is used in plotting the I-V curve for the sweep.

At decision block 1112, the user may be prompted to adjust a measurement period. The prompt may be in the form of a direct display of a question as to whether or not the user would like to make an adjustment. The prompt may also be indirect, such as for example, a cursor may be placed on the display of the waveform monitor 108 indicating a location for entering an adjustment period value. The user may enter a time value, which may then be stored and used as the measurement period in subsequent sweeps. The measurement period is the time period or the width of the measurement aperture, which represents the amount of time during which the drain voltage ($V_D$) and/or the drain current ($I_D$) may be measured.

If the user either inputs an indication that the measurement period is to be adjusted or if a new measurement period will be entered, the user entry of an adjusted measurement period is enabled at step 1114. At step 1116, the user-entered measurement period is set as the new time period of the measurement aperture. Subsequent sweeps use the new measurement period to sample the voltage and current values. The adjustment of the measurement period is indicated graphically by a change in the width of the measurement aperture.

At decision block 1118, the user may be prompted to adjust the "measurement delay to start," which is a time period to delay taking a measurement of the voltage or current after the start of the pulse period. The measurement delay to start provides a starting point for the start of the measurement period, which is indicated graphically as the left edge of the measurement aperture. It is noted that the display of the pulse may indicate where the pulse is not stable. Typically, the lack of stability in the pulse is at the beginning of the time period of the pulse. The user may adjust the measurement delay to start parameter to begin after the pulse has settled to a level.

At step 1120 (the "yes" path out of the decision block 1118), the user is prompted or permitted to enter a new measurement delay to start. Entry of the value of the new measurement delay to start may be accomplished by a direct entry of a time value. In an example implementation, the device analyzer 100 includes GUI tools that may permit the user to move the measurement aperture on the display by selecting and sliding the measurement aperture along the time axis. At step 1122, the user entered time period is set as the new measurement delay to start value. The display is adjusted to reflect the change. An adjustment to the measurement delay to start is indicated graphically by a shift in the position of the measurement aperture relative to the pulse period.

At step 1124, the pulsed waveform sweep is continued using any new parameters entered by the user. The pulse waveform analyzer remains available should the user wish to make further adjustments. The waveform monitor 108 may continue to redraw the pulses at the current point 1202 on the I-V curves as the I-V sweeps continue. The user may select another point 1202 at any time to analyze the pulse waveforms at any location of the I-V curve traces.

Figure 11B:
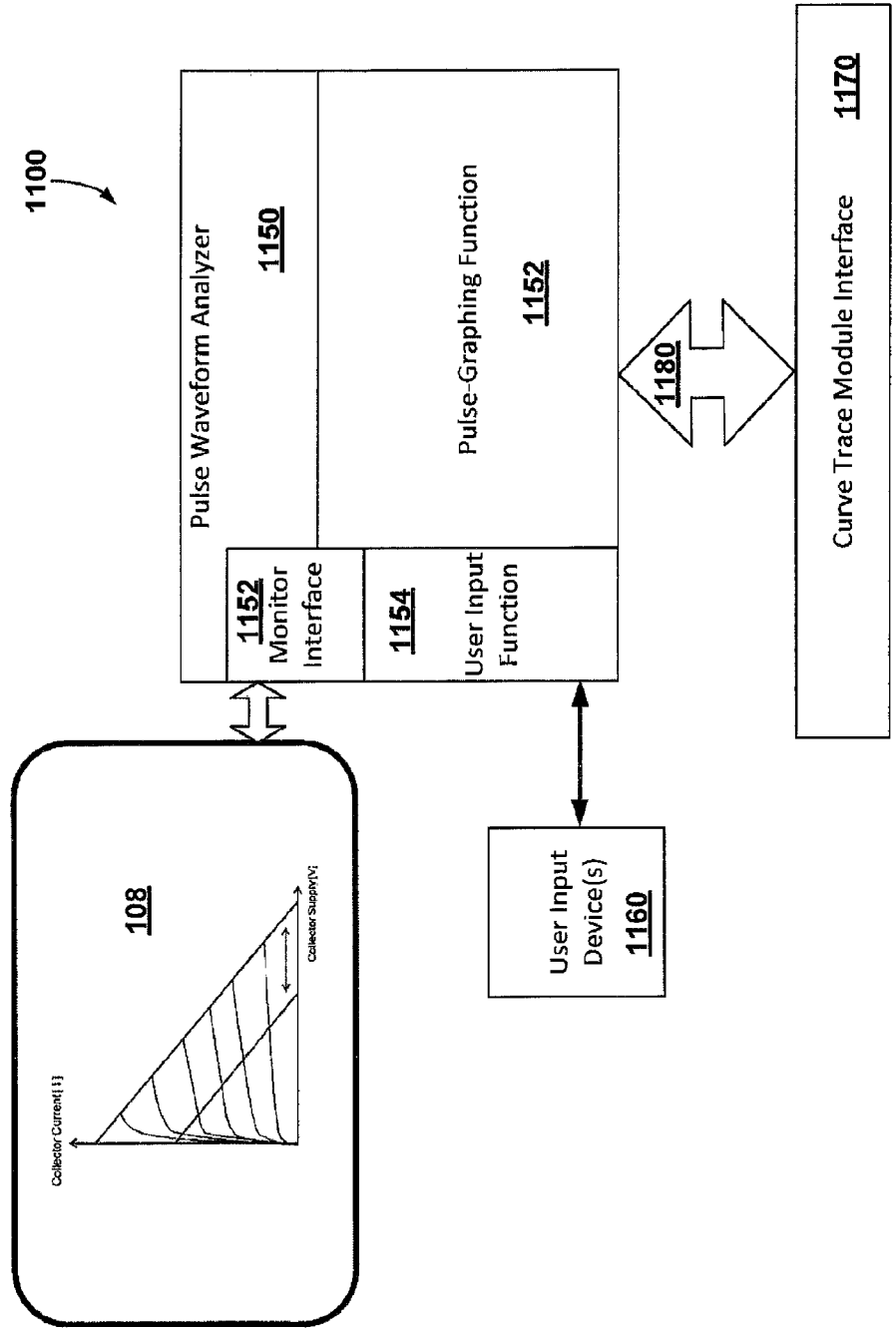
FIG. 11B is a block diagram of an example implementation of a pulse waveform analyzer.
Figure 12A:
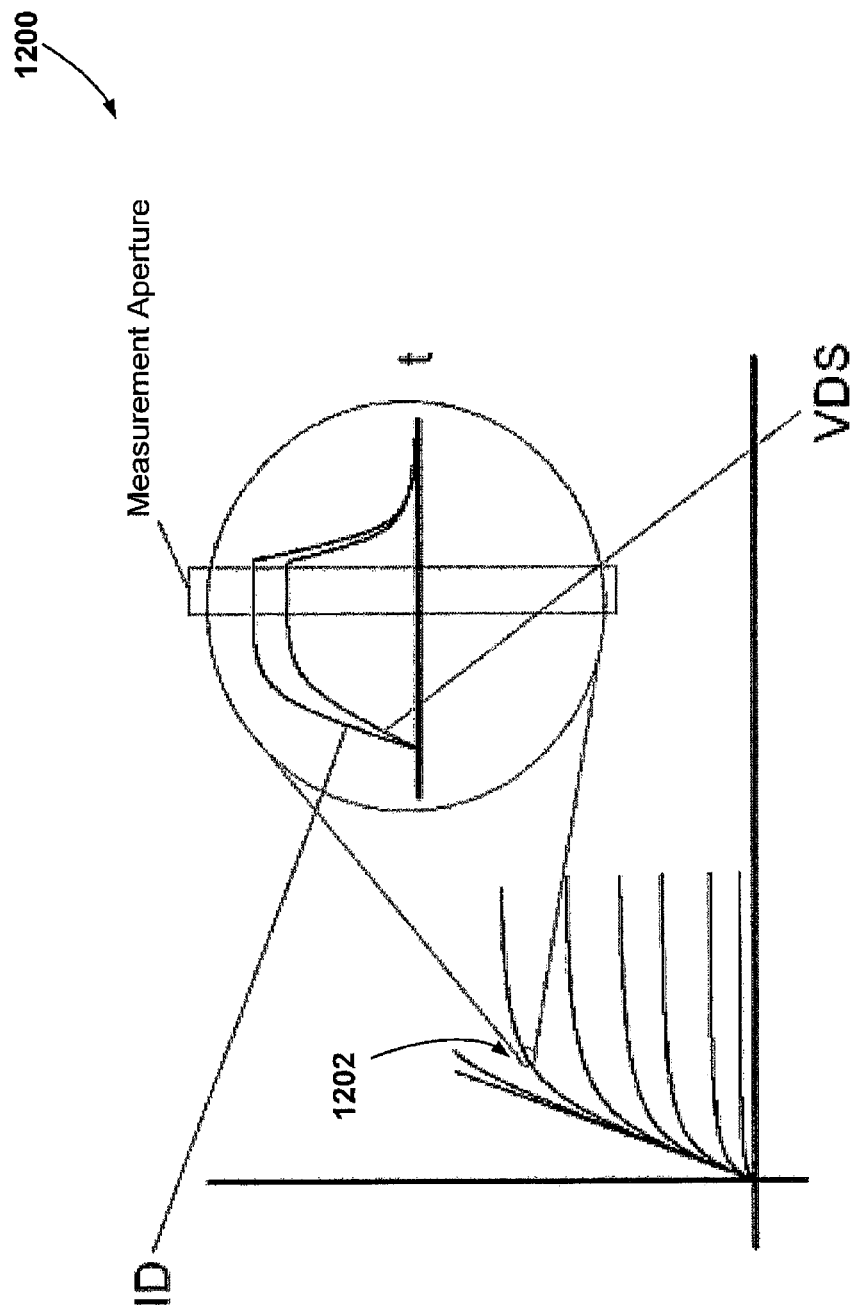
FIG. 12A is a graph illustrating operation of a pulse waveform analyzer.
Figure 12B:
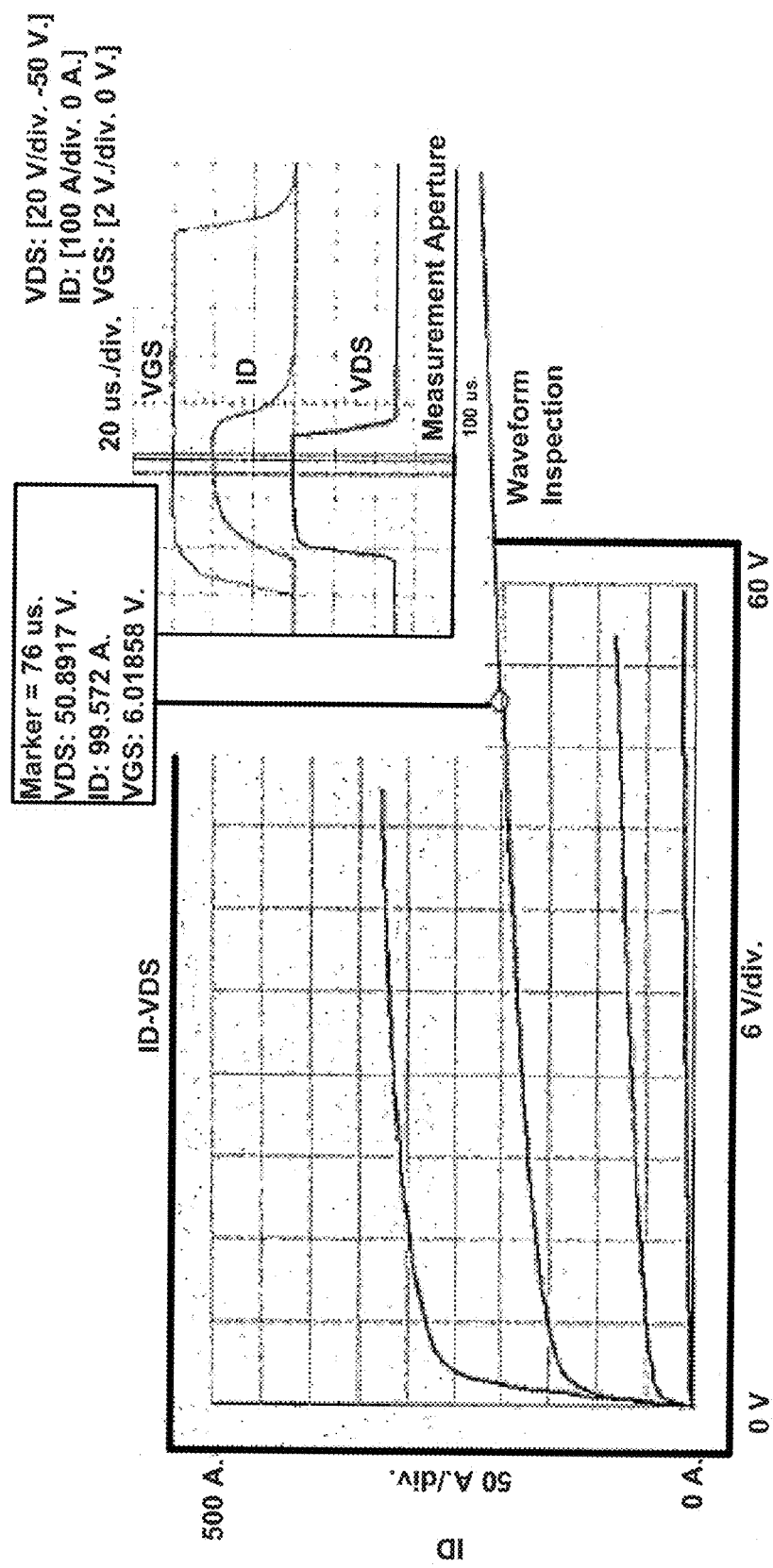
FIG. 12B is another graph illustrating operation of a pulse waveform analyzer.

FIG. 11B is a block diagram of an example implementation of the pulse waveform analyzer 1100. As noted above, the pulse waveform analyzer 1100 may be implemented as a software component in the device analyzer 100 (in FIG. 1). The pulse waveform analyzer 1100 includes a pulse waveform analyzer 1150, a pulse-graphing function 1152, a monitor interface 1156, and a user input interface 1154 to suitable user input devices 1160. The pulse waveform analyzer 1100 may include a curve trace module interface 1170 via hardware and software drivers 1180 that connect the pulse waveform analyzer 1100 to the curve trace module interface 1170. The curve trace module interface 1170 may be implemented in an example implementation over the module interconnect 106 in FIG. 1.

The pulse waveform analyzer 1100 includes the user input function 1160 to facilitate user entry of selectable pulse parameters including a measurement period in which the voltmeter and current meter can take voltage and current measurements, and a delay to start a measurement period indicating a time to wait to start the measurement period after the start of the narrow pulse period of the narrowed sweep signal pulses. The pulse graphing function 1152 provides functions:

1. to graph a pulse waveform corresponding to one of the narrowed sweep signal pulses,
2. to display the measurement period and measurement delay to start period,
3. to indicate period time values for the measurement period and pulse period of the narrowed sweep signal pulse, and
4. to super-impose the pulse waveform trace on a display of I-V waveforms on the waveform monitor.

VI. Signal Clip Function for I-V Sweeps

The collector supply in a curve tracer typically includes output resistors that are typically variable resistors. The output resistors may be used to establish a power limit on the curve traces. The value of the output resistor during a given curve trace appears on the curve trace, along with the resistance of the DUT, as a load line, which connects the end points of each curve trace for each gate setting, or secondary sweep voltage. That is, the slope of the load line indicates the value of the sum of the output resistance and the resistance of the DUT. The user may adjust the output resistance to set a maximum power limit. During a voltage sweep, the sweep is limited to the voltage value corresponding to the maximum power limit. During a current sweep, the sweep is limited to the current value corresponding to the maximum power limit.

During the I-V curve trace of a high power device, the collector supply voltage is increased in order to observe a large current at high voltage. However, if the breakdown voltage of the device is on the load line bringing it within the range of voltages at which the device is tested, there is a risk that the device would breakdown during the test. The risk of breakdown limits the information that may be obtained from an I-V trace. If the device breakdown voltage is within the maximum power limit indicated by the load line, the device may break down before a voltage that is less than the breakdown voltage is reached in subsequent secondary voltage sweeps.

Figure 13:
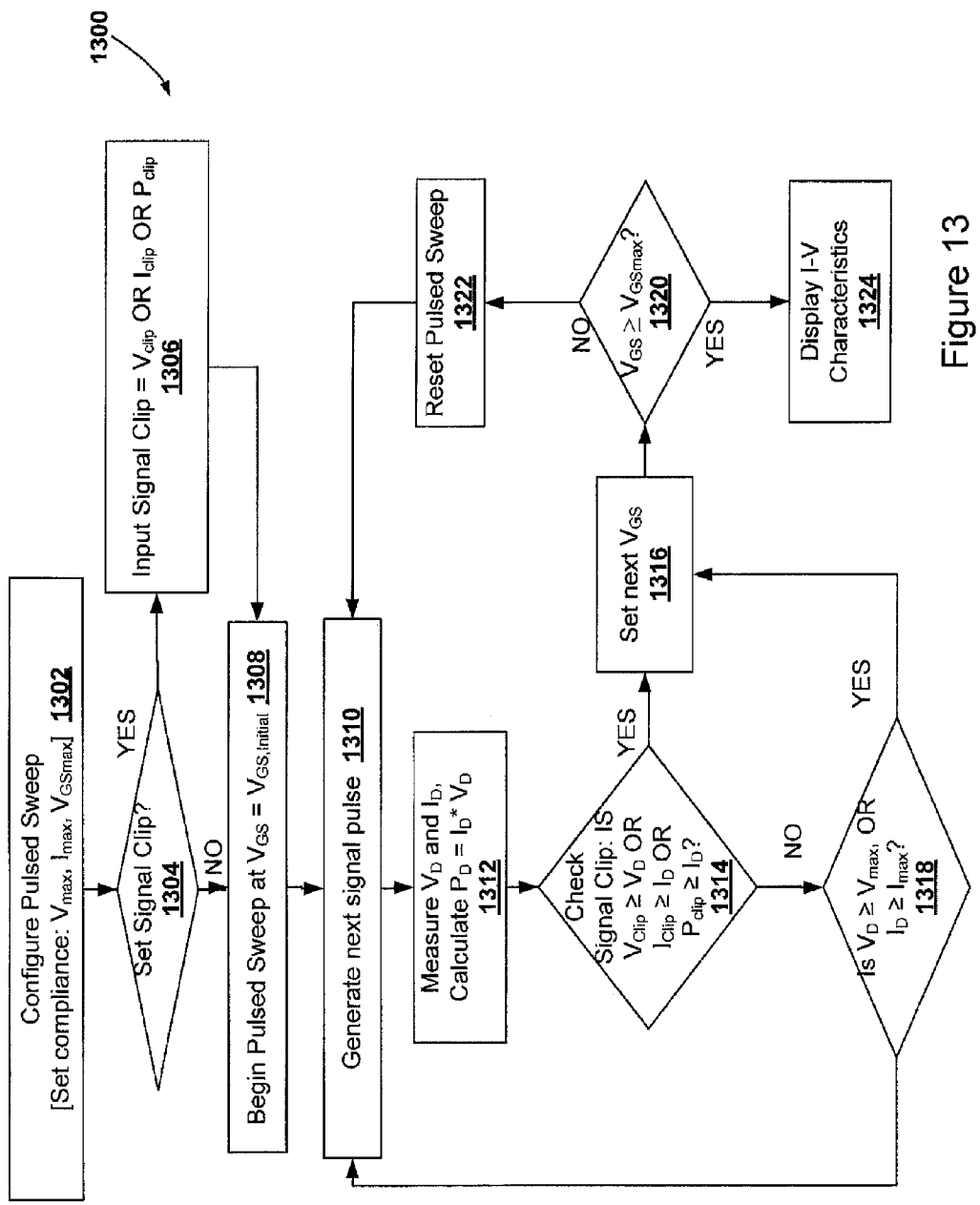
FIG. 13 is a flowchart of an example method for setting a signal clip for an I-V curve trace.

In order to ensure that testing can be performed at desired voltage and current levels, a signal clip may be defined by the user as a limit during sweeps designed to avoid approaching break down. FIG. 13 is a flowchart of a signal clip function 1300 illustrated as an example method for setting a signal clip for an I-V curve trace.

A signal clip may be defined during configuration of an I-V curve trace. At step 1302, a pulsed sweep may be configured for an I-V curve trace. The configuration of the pulsed sweep may include setting limits on the drain voltage, drain current, and gate signals. The limits may be set directly, or by adjusting the output resistance. During configuration of the I-V curve trace, the user may be asked if a signal clip is to be set at decision block 1304. If the user indicates that a signal clip is to be set, the user enters a value for either a voltage clip ($V_{clip}$), a current clip ($I_{clip}$), or a power clip ($P_{clip}$).

At step 1308, the pulsed sweep is started at a first secondary sweep voltage value by generating the first sweep signal pulse. At step 1310, the next signal pulse is generated. At step 1312, the drain voltage ($V_D$) and the drain current ($I_D$) are measured, and a power value may be calculated using the measured voltage and current values. At decision block 1314, the measured drain voltage ($V_D$) and/or drain current ($I_D$) values, or the calculated power value ($P_{clip}$), are compared with the corresponding signal clip value.

If the measured or calculated value is greater than or equal to the corresponding signal clip value, the sweep for the current secondary sweep setting is stopped. At step 1316, the next secondary sweep level is set for a next sweep. At decision block 1320, the secondary sweep level is checked to determine if the range has been reached. If decision block 1320 indicates that the last secondary sweep level has been reached, the I-V characteristics are displayed as a complete set in step 1324. If decision block 1320 indicates that a next sweep is to be conducted for the next secondary sweep level, the pulsed sweep is reset at step 1322. The next signal pulse is generated at step 1310 and the steps of comparing the measured/calculated values to the signal clip are repeated.

Figure 14:
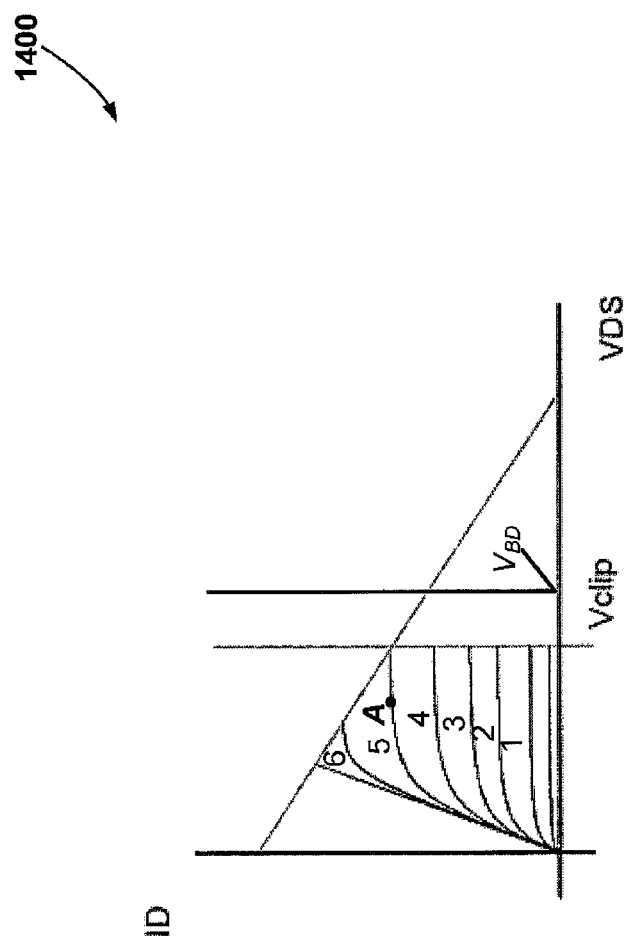
FIG. 14 is a graph illustrating an example I-V curve trace implemented with a voltage clip.

FIG. 14 is a graph illustrating an example I-V curve trace 1400 implemented with a voltage clip. The graph of the I-V curve trace 1400 includes an indication of a breakdown voltage $V_{BV}$ for the DUT, and curve trace for each of secondary sweep levels 1-6. The voltage clip $V_{clip}$ is set at a level that is lower than the breakdown voltage $V_{BV}$ for the DUT. As the I-V curve trace 1400 in FIG. 14 indicates, the behavior of the DUT at a point A in secondary sweep level 5 would not be analyzed without setting the voltage clip, $V_{clip}$.

VII. High-Voltage, High-Current Fast Switch Curve Trace Module

Figure 15A:
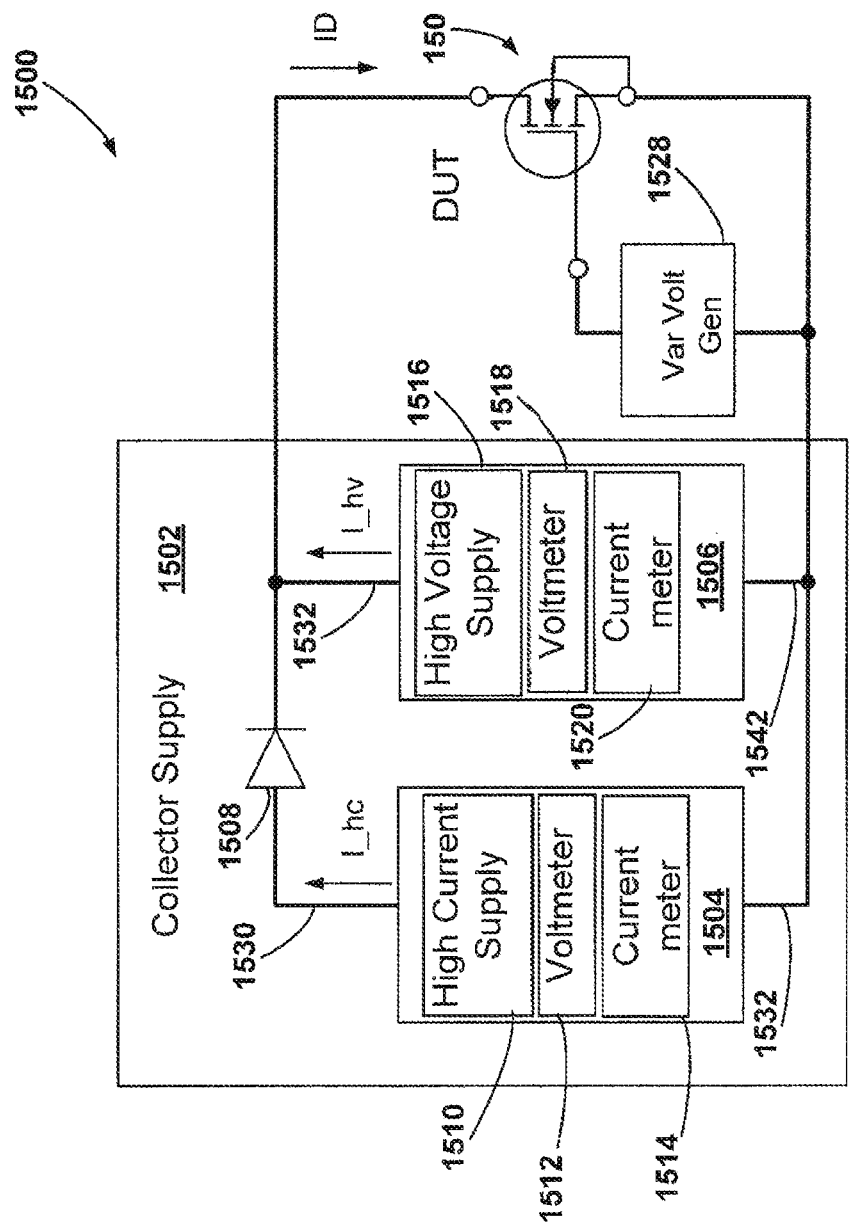
FIG. 15A is a schematic diagram of an example of a high-voltage, high-current fast switch curve trace module.

FIG. 15A is a schematic diagram of an example of a high-voltage, high-current fast switch curve trace module 1500. The high-voltage, high-current fast switch ("Fast Switch") curve trace module 1500 includes Fast Switch collector supply 1502 that includes a high-current multi-function unit 1504, a high-voltage multi-function unit 1506, and a current source protecting diode 1508. The Fast Switch collector supply 1502 provides a drain current $I_D$ to the DUT 150. A secondary sweep signal generator 1528 generates a gate signal to provide secondary sweeps during curve traces. The Fast Switch curve trace module 1500 in FIG. 15 is configured to perform I-V curve traces for the DUT 150, and to perform tests that analyze three-terminal devices subject to current collapse from a stress voltage.

The high-current multi-function unit 1504 in the Fast Switch collector supply 1502 includes a high current source component 1510, a voltage meter component 1512, and a current meter component 1514. The high-current multi-function unit 1504 is configured to operate as a current supply on a current path between a current source terminal 1530 and a current common terminal 1532.

The high-voltage multi-function unit 1506 includes a high voltage source component 1516, a voltage meter component 1518, and a current meter component 1520. The high voltage multi-function unit 1506 is configured to generate a selectable voltage at a voltage source terminal 1540 and a voltage common terminal 1542. The high-voltage multi-function unit 1506 is connected in parallel with the high-current multi-function unit 1504 with the voltage common terminal 1542 connected to the current common terminal 1532.

The current source protecting diode 1508 is forward-bias connected between the high-current multi-function unit 1504 at the current source terminal 1530 and the high-voltage multi-function unit 1506 at the voltage source terminal 1540 to block current from the high-voltage multi-function unit 1506 from flowing to the high-current multi-function unit 1504 when the DUT 150 is turned off. The current source protecting diode 1508 permits current to flow from the high-current multi-function unit 1504 when the DUT 150 is turned on.

In a test measurement to analyze the behavior of the DUT 150 subjected to a stress voltage, the first, second, and third DUT ports 132, 134, 136 are switched to connect to the Fast Switch curve trace module 1500. The voltage meter component 1518 in the high-voltage multi-function unit 1506 measures the voltage at the DUT 150. The current meter component 1514 in the high-current multi-function unit 1504 measures the current through the DUT 150.

During the testing, a selectable voltage generated by the high-voltage multi-function unit 1506 is applied across the DUT 150 as a stress voltage. After a time, the gate signal is switched to turn the DUT 150 on. The voltage and current at the DUT 150 are graphed over time to permit analysis of a current and voltage response over time. Current measurements are obtained by adding the current from the high-current multi-function unit 1504 to the current from the high-voltage multi-function unit 1506. The sum is the drain current $I_D$.

Figure 15B:
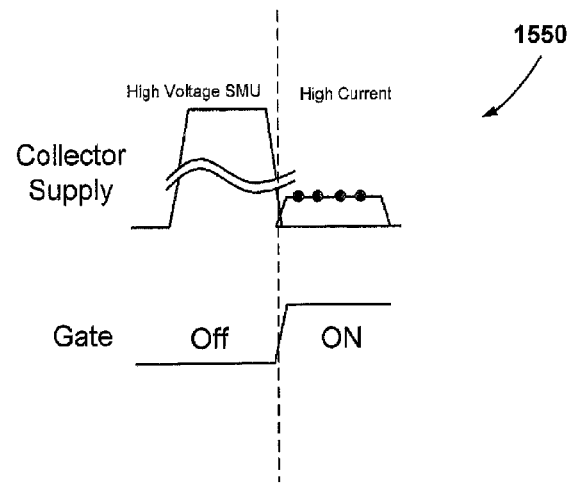
FIG. 15B is a graph illustrating operation of the high-voltage, high-current fast switch curve trace module in FIG. 15A.
Figure 15C:
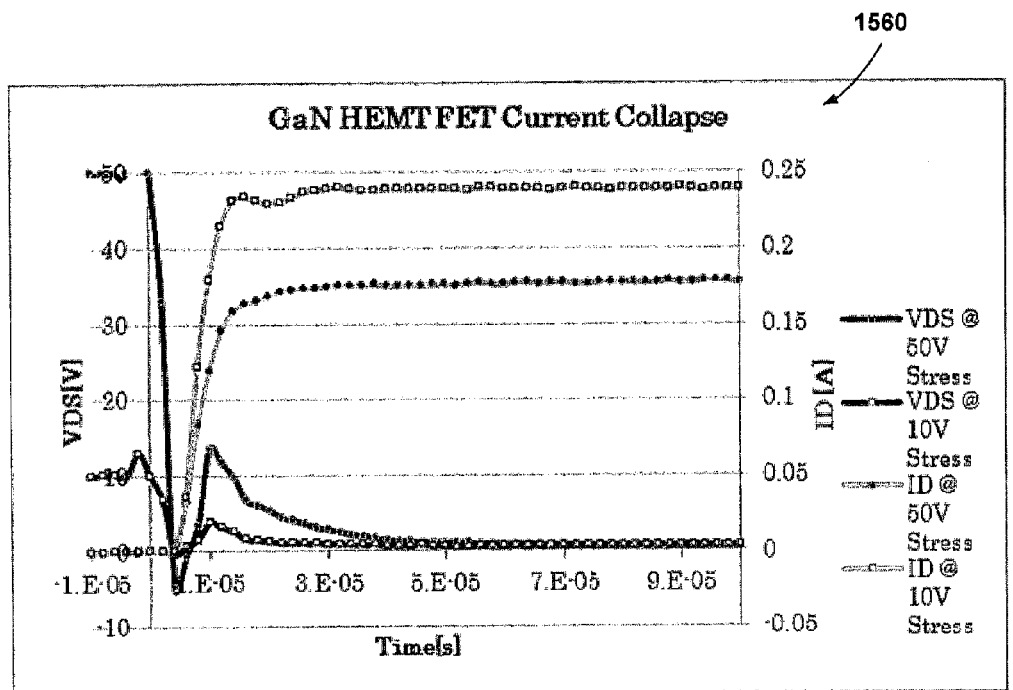
FIG. 15C is another graph illustrating operation of the high-voltage, high-current fast switch curve trace module in FIG. 15A.

FIG. 15B is a graph 1550 schematically illustrating operation of the high-voltage, high-current fast switch curve trace module 1500 in FIG. 15A. FIG. 15B shows the voltage from the high voltage multi-function unit 1506 operating as a stress voltage on the DUT 150. When the gate is switched to turn the DUT 150 on, the voltage at the Fast Switch collector supply 1502 drops in response to the drop of the voltage across the DUT 150. The current through the DUT 150 should increase when the DUT 150 is turned on, but instead remains low for a period of time. FIG. 15C is another graph 1560 illustrating operation of the high-voltage, high-current fast switch curve trace module 1500 in FIG. 15A. The graph 1560 in FIG. 15C includes test data generated from a test performed by an example implementation of the Fast Switch curve trace module 1500.

Figure 16A:
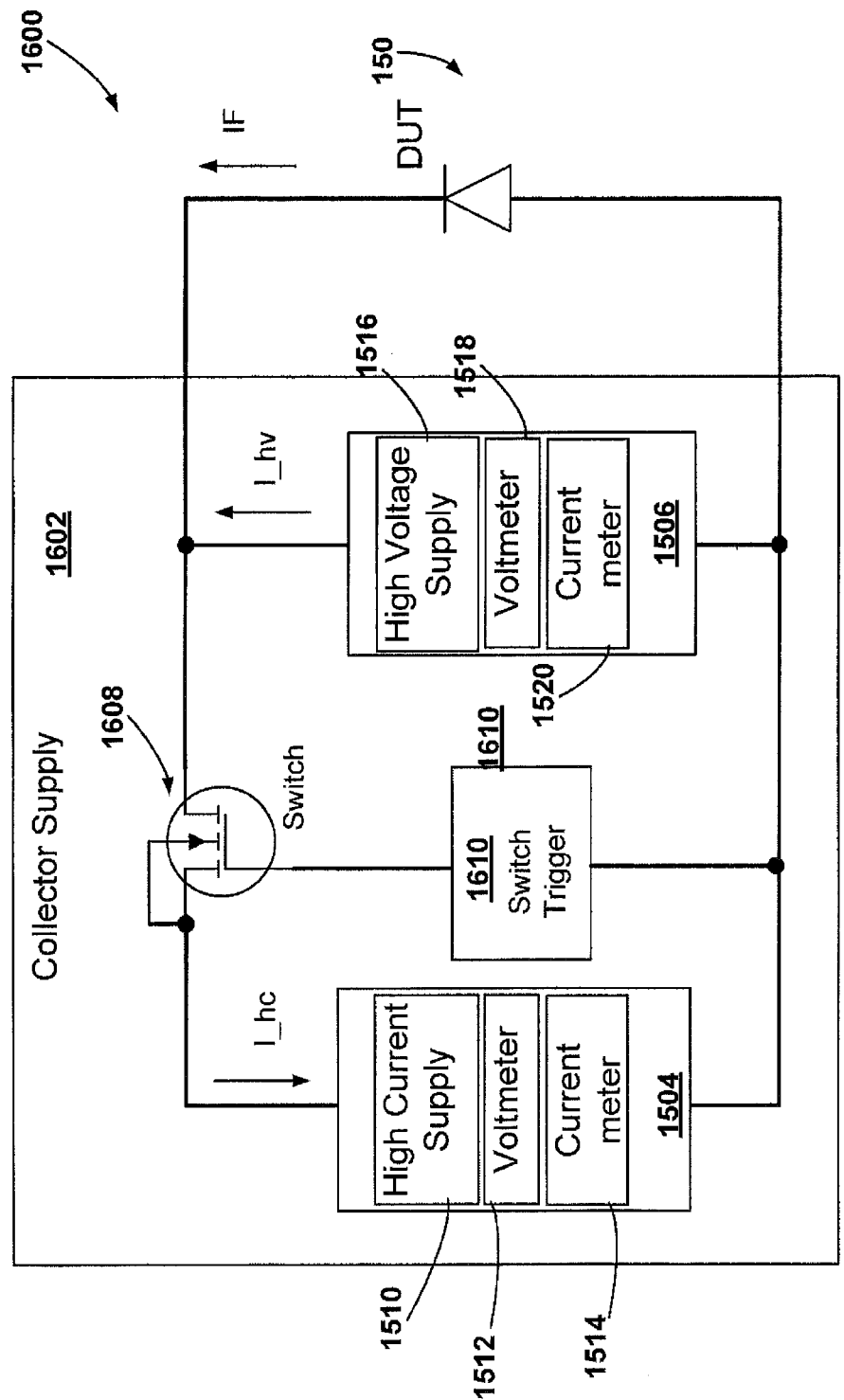
FIG. 16A is a schematic diagram of another example of a high-voltage, high-current fast switch curve trace module.

FIG. 16A is a schematic diagram of another example of a high-voltage, high-current fast switch curve trace module 1600. The high-voltage, high-current fast switch ("Fast Switch") curve trace module 1600 includes Fast Switch collector supply 1602 that includes the high-current multi-function unit 1504 and the high-voltage multi-function unit 1506 used in the Fast Switch curve trace module 1500 in FIG. 15A. The Fast Switch collector supply 1602 also includes a current source protecting switch 1608 and a switch-gating signal generator 1610. The Fast Switch collector supply 1602 provides a forward bias current $I_F$ to the DUT 150. The Fast Switch curve trace module 1600 in FIG. 16A is configured to perform tests that analyze two e-terminal devices subject to current collapse from a stress voltage.

The current source protecting switch 1608 is connected between the high-current multi-function unit 1504 and the high-voltage multi-function unit 1506 to block current generated by the high-voltage multi-function unit 1506 from flowing to the high-current multi-function unit 1504 when the current source protecting switch 1608 is turned off. The current source protecting switch 1608 operates as a current source for the DUT 150 when the current source protecting switch 1608 is turned on. The switch-gating signal generator 1610 generates a gate signal to turn the current protecting switch 1608 on and off.

During a test to analyze current collapse of a two-terminal DUT 150, with the current source protecting switch 1608 in the off state, the voltage generated by the high-voltage multi-function unit 1506 is applied as a reverse-bias across the DUT 150. The gate signal is switched to turn the current-protecting switch 1608 on, and the voltage and current at the DUT 150 are graphed over time to permit analysis of current and voltage response over time.

Figure 16B:
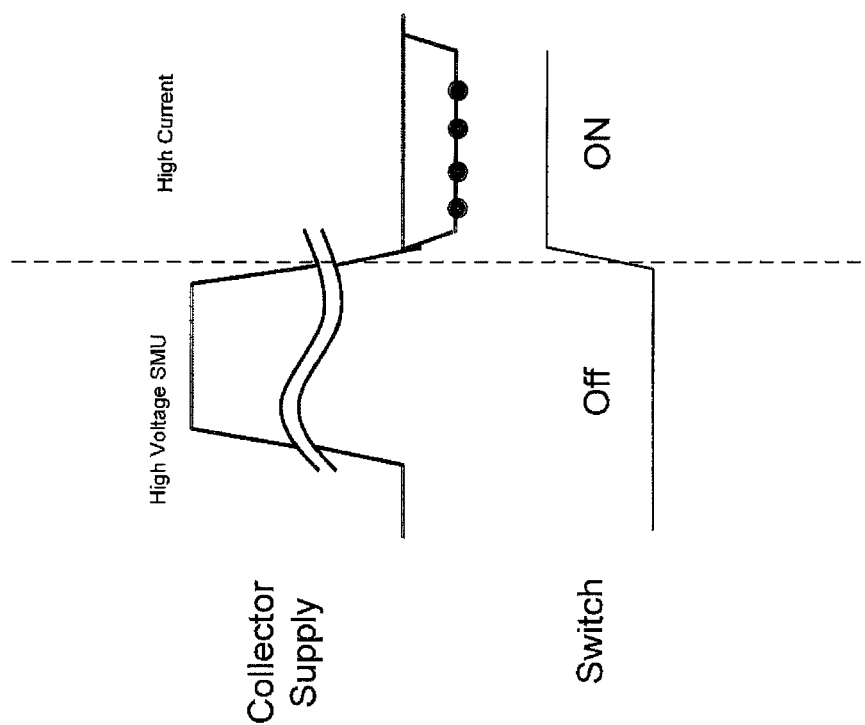
FIG. 16B is a graph illustrating operation of the high-voltage, high-current fast switch curve trace module in FIG. 16A.

FIG. 16B is a graph illustrating operation of the high-voltage, high-current fast switch curve trace module in FIG. 16A.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. A device analyzer comprising:
a collector supply configured to generate a plurality of supply signal pulses with selected voltage or current levels and a supply signal pulse width at a high current capacity at a collector supply source terminal when a device-under-test ("DUT") is connected to form a current path between the collector supply source terminal and a collector supply common terminal, the collector supply comprising: a current source to generate current up to a peak current rating; a current source capacitor disposed across the current source configured to enable the current source to charge the current source capacitor, and configured to supply a collector supply current to the current path, the current source capacitor configured to provide the high current capacity of the collector supply that is higher than the peak current rating of the current source: a supply voltage generator configured to generate a plurality of variable voltage pulses with the supply signal pulse width and selected voltage levels on the collector supply source terminal; and a buffer amplifier connected to buffer the variable voltage pulses from the supply voltage generator, the buffer amplifier powered by the current source capacitor to provide substantially all of the collector supply current from the current source capacitor at the collector supply source terminal;
a supply switch connected to the collector supply source terminal, the supply switch triggered to close and open the current path in a narrow pulse width narrower than the supply signal pulse width to conduct the plurality of supply signal pulses as a plurality of narrowed sweep signal pulses having the high current capacity of the collector supply current, or to regulate the current in the current path to a selected constant current level;
wherein the supply switch is controlled by a supply switch driver configured to generate switch trigger pulses having a narrow pulse width, the switch pulses generated by a supply switch driver;
a first DUT port configured to connect to the supply switch; a second DUT port configured to connect to the collector supply common terminal, where the plurality of supply signal pulses are applied to the DUT when the DUT is connected to the first and second DUT ports; a voltage meter configured to measure a DUT voltage across the DUT within the narrow pulse width of the narrowed sweep signal pulses when the plurality of sweep signal pulses at the DUT are the plurality of narrow sweep signal pulses; and a current meter configured to measure a DUT current through the DUT within the narrow pulse width of the narrowed sweep signal pulses when the plurality of sweep signal pulses at the DUT are the plurality of narrow sweep signal pulses.

2. The device analyzer of claim 1 further comprising:
a gate signal generator configured to generate a gate signal at a gate DUT port to provide the gate signal to the DUT when the DUT is a three-terminal device with a terminal connected to the gate DUT port; and
a controller configured to operate the device analyzer in a narrow pulse voltage mode by:
controlling the current source, the supply voltage generator, and the supply switch driver to generate the plurality of narrowed sweep signal pulses at varying voltage or current to provide a voltage or current; and
controlling the gate signal generator to generate gate signals having different voltages where the plurality of narrowed sweep signal pulses is generated for the different voltages of the gate signal.

3. The device analyzer of claim 1 where the supply switch is configured to regulate current level in the current loop, the device analyzer further comprising: a controller configured to operate in a constant current source mode by: controlling the supply switch driver to set an output current level through the supply switch and adjusting the output current level through a current sweep; controlling the supply voltage generator to generate the plurality of variable voltages during the current sweep; measuring a DUT voltage and a DUT current at each of the plurality of variable voltages; and calculating DUT characteristics including DUT resistance values for the measured DUT voltages and currents.

4. The device analyzer of claim 1 further comprising:
at least one multi-function unit comprising a variable pulsed current source component, a variable pulsed voltage source component, a current meter component, and a voltage meter component;
where the supply voltage generator is implemented using a variable pulsed voltage source component in a first multi-function unit, and the supply switch driver is implemented using a variable pulsed voltage source component or a variable pulsed current source component in a second multi-function unit.

5. The device analyzer of claim 4 where:
the current meter is implemented using a first differential amplifier comprising differential inputs connected across the variable output resistor and a first differential amplifier output connected to the second multi-function unit, the second multi-function unit further configured to use the first differential amplifier output to determine a current level at the variable output resistor; and
the voltage meter is implemented using a second differential amplifier comprising differential inputs connected across the DUT and a second differential amplifier output connected to the first multi-function unit, the first multi-function unit further configured to determine the voltage across the DUT.

6. The device analyzer of claim 2 where the controller is further configured to operate in a constant current source mode by:
controlling the current source, the supply voltage generator, and the supply switch driver to generate the plurality of narrowed sweep signal pulses at a constant voltage and varying current levels to sweep current from a low current level to a desired current level, and
where the supply switch comprises:
a switching element configured to close when triggered by the second pulse when operating in the narrow pulse voltage mode; and
a regulating element configured to conduct a selected current level when triggered by the second pulse when operating in the constant current source mode.

7. The device analyzer of claim 1 further comprising:
a waveform monitor configured to display voltage and current measurements in user-configurable traces including current-voltage ("I-V") waveforms;
a pulse waveform analyzer comprising:
a user input function to facilitate user entry of selectable pulse parameters including a measurement period in which the voltmeter and current meter can take voltage and current measurements, and a delay to start a measurement period indicating a time to wait to start the measurement period after the start of the narrow pulse period of the narrowed sweep signal pulses; and
a pulse graphing function configured to graph a pulse waveform corresponding to one of the narrowed sweep signal pulses, to display the measurement period and delay to start the measurement period, to indicate period time values for the measurement period and pulse period of the narrowed sweep signal pulse, and to super-impose the pulse waveform trace on a display of I-V waveforms on the waveform monitor.

8. The device analyzer of claim 1 further comprising:
a signal clip function configured to compare a DUT measurement with a signal clip value during a signal sweep for providing I-V waveform characteristics for the DUT, where the signal clip value is a user selectable voltage, current or power value selected to limit the voltage or current in the DUT.

9. The device analyzer of claim 1 where the collector supply, the supply voltage generator, the supply switch, the supply switch driver, the voltmeter, and the current meter are implemented in a high current curve trace module, the device analyzer further comprising a high-voltage medium current curve trace module, the high-voltage medium current curve trace module comprising:
a second collector supply configured to operate as a high-voltage DC supply for analyzing the DUT at voltage levels of the DUT greater than a breakdown voltage, and to operate as a variable voltage and narrow pulse supply for analyzing I-V characteristics of the DUT, the second collector supply being switchable between the high-voltage DC supply and the variable voltage and narrow pulse supply;
a second gate signal generator configured to generate a gate signal to the DUT when the DUT is a three-terminal device;
a second voltage meter configured to measure a voltage across the DUT; and
a second current meter configured to measure a current level through the DUT;
where the first, second, and third DUT ports are switched to connect to the high-voltage medium current trace module.

10. The device analyzer of claim 9 further comprising:
a waveform monitor configured to display voltage and current measurements in user-configurable traces including current-voltage ("I-V") waveforms;
a pulse waveform analyzer comprising:
a user input function to facilitate user entry of selectable pulse parameters including a measurement period in which the second voltmeter and second current meter can take voltage and current measurements, and a delay to start a measurement period indicating a time to wait to start the measurement period after the start of a pulse period of the sweep signal; and
a pulse graphing function configured to trace a pulse waveform corresponding to the sweep signal pulse, to display the measurement period and delay to start the measurement period, to indicate period time values for the measurement period and pulse period of the sweep signal pulse, and to super-impose the pulse waveform trace on a display of I-V waveforms on the waveform monitor.

11. The device analyzer of claim 9 further comprising:
a signal clip function configured to compare a sweep signal level with a signal clip value during a signal sweep for providing I-V waveform characteristics for a DUT, where the signal clip value is a user selectable voltage, current or power value selected to limit the voltage or current in the DUT.

12. The device analyzer of claim 2 where the collector supply, the supply voltage generator, the supply switch, the supply switch driver, the voltmeter, and the current meter are implemented in a high current curve trace module, the device analyzer further comprising a high-voltage curve trace module, the high-voltage curve trace module comprising:
a high-voltage multi-function unit comprising a variable pulsed voltage source component and a voltage meter component, the high-voltage multi-function unit configured to operate as a pulsed power supply with a peak voltage rating;
a high-voltage amplifier connected to amplify a voltage generated by the high-voltage multi-function unit, the high-voltage amplifier configured to generate a voltage sweep signal having a variable voltage level ranging from a low level to a high level greater than the peak voltage rating and a pulse width determined by the high-voltage multi-function unit;
a voltage divider connected to an output of the high-voltage amplifier at one end of the voltage divider and another end of the voltage divider connected to the high-voltage multi-function unit opposite, the voltage divider comprising a divided voltage node connected to the voltage meter component of the high-voltage multi-function unit;
a third current meter configured to measure down to a pico-ampere level current the third current meter disposed in a return current path to the variable pulsed voltage source component of the high-voltage multi-function unit to measure the current level in the DUT;

where the first and second DUT ports are switched to connect to the high-voltage curve trace module at the output of the high-voltage amplifier and the third current meter, respectively, and where the voltage meter component in the high-voltage multi-function unit measures the voltage at the DUT, and the third current meter measures the current through the DUT as the high-voltage amplifier is varied.

13. The device analyzer of claim 12 further comprising:
a gate signal generator configured to generate a gate signal to a gate DUT port to provide the gate signal to the DUT when the DUT is a three-terminal device with a terminal connected to the gate DUT port.

14. The device analyzer of claim 12 further comprising:
a waveform monitor configured to display voltage and current measurements in user-configurable traces including current-voltage ("I-V") waveforms;
a pulse waveform analyzer comprising:
a user input function to facilitate user entry of selectable pulse parameters including a measurement period in which the voltage meter component of the high-voltage multi-function unit and third current meter can take voltage and current measurements, and a delay to start a measurement period indicating a time to wait to start the measurement period after the start of a pulse period of the voltage sweep signal; and
a pulse graphing function configured to trace a pulse waveform corresponding to the voltage sweep signal, to display the measurement period and delay to start the measurement period, to indicate period time values for the measurement period and pulse period of the voltage sweep signal, and to super-impose the pulse waveform trace on a display of I-V waveforms on the waveform monitor.

15. The device analyzer of claim 2 where the collector supply, the supply voltage generator, the supply switch, the supply switch driver, the voltmeter, and the current meter are implemented in a high current curve trace module, the device analyzer further comprising a high-voltage, high current fast switch curve trace module, the high-voltage, high current fast switch curve trace module further comprising:
a high-voltage multi-function unit comprising a variable pulsed voltage source component and a voltage meter component, the high-voltage multi-function unit comprising a voltage source terminal and a voltage common terminal and configured to generate a selectable pulsed voltage;
a high-current multi-function unit comprising a variable pulsed current source component and a current meter component, the high current multi-function unit comprising a current source terminal and a current common terminal, and configured to operate as a current supply, the high-current multi-function unit connected in parallel with the high-voltage multi-function unit where the voltage common terminal is connected to the current common terminal;
a current source protecting diode connected between the high-current multi-function unit at the current source terminal and the high-voltage multi-function unit at the voltage source terminal to block current from the high-voltage multi-function unit from flowing to the high-current multi-function unit when the DUT is turned off, and to permit current to flow from the high-current multi-function unit when the DUT is turned on; and a second gate signal generator configured to generate a gate signal to the DUT when the DUT is a three-terminal device;
where the first, second, and third DUT ports are switched to connect to the high-voltage high-current fast switch curve trace module at the voltage source terminal of the high-voltage multi-function unit, at the voltage common terminal of the high-voltage multi-function unit, and the second gate signal generator, respectively;
where the voltage meter component in the high-voltage multi-function unit measures the voltage at the DUT, the current meter component in the high-current multi-function unit measures the current through the DUT; and
where the selectable pulsed voltage generated by the high-voltage multi-function unit is applied across the DUT, the gate signal is switched to turn the DUT on, and the voltage and current at the DUT are graphed over time to permit analysis of a current and voltage response over time.

16. The device analyzer of claim 15 further comprising:
a waveform monitor configured to display voltage and current measurements in user-configurable traces including voltage and current values over time;
a pulse waveform analyzer comprising:
a user input function to facilitate user entry of selectable pulse parameters including a measurement period in which the voltage meter component of the high-voltage multi-function unit and the current meter component in the high-current multi-function component can take voltage and current measurements, and a delay to start a measurement period indicating a time to wait to start the measurement period after the start of a pulse period of the voltage sweep signal; and
a pulse graphing function configured to trace a pulse waveform corresponding to the selectable pulsed voltage, to display the measurement period and delay to start the measurement period, to indicate period time values for the measurement period and pulse period of the voltage sweep signal, and to super-impose the pulse waveform trace on a display of I-V waveforms on the waveform monitor.

17. The device analyzer of claim 1 where the collector supply, the supply voltage generator, the supply switch, the supply switch driver, the voltmeter, and the current meter are implemented in a high current curve trace module, the device analyzer further comprising a high-voltage, high current fast switch curve trace module, the high-voltage, high current fast switch curve trace module further comprising:
a high-voltage multi-function unit comprising a variable pulsed voltage source component and a voltage meter component, the high-voltage multi-function unit comprising a voltage source terminal and a voltage common terminal and configured to generate a selectable pulsed voltage;
a high-current multi-function unit comprising a variable pulsed current source component and a current meter component, the high current multi-function unit comprising a current source terminal and a current common terminal, and configured to operate as a current supply, the high-current multi-function unit connected in parallel with the high-voltage multi-function unit where the voltage common terminal is connected to the current common terminal;
a current source protecting switch connected between the high-current multi-function unit at the current source terminal and the high-voltage multi-function unit at the voltage source terminal to block current from the high-voltage multi-function unit from flowing to the high-current multi-function unit when the current source protecting switch is turned off, and to operate as a current source for the DUT when the current source protecting switch is turned on; and a switch-gating signal generator configured to generate a gate signal to the current protecting switch;

where the DUT is a two-terminal device, the first and second DUT ports are switched to connect to the high-voltage high-current fast switch curve trace module at the voltage source terminal of the high-voltage multi-function unit and at the voltage common terminal of the high-voltage multi-function unit, respectively;

where the voltage meter component in the high-voltage multi-function unit measures the voltage at the DUT, the current meter component in the high-current multi-function unit measures the current through the DUT; and where the selectable pulsed voltage generated by the high-voltage multi-function unit is applied as a reverse-bias across the DUT, the gate signal is switched to turn the current-protecting switch on, and the voltage and current at the DUT are graphed over time to permit analysis of current and voltage response over time.

18. The device analyzer of claim 17 further comprising:
a waveform monitor configured to display voltage and current measurements in user-configurable traces including voltage and current values over time;
a pulse waveform analyzer comprising:
a user input function to facilitate user entry of selectable pulse parameters including a measurement period in which the voltage meter component of the high-voltage multi-function unit and the current meter component in the high-current multi-function component can take voltage and current measurements, and a delay to start a measurement period indicating a time to wait to start the measurement period after the start of a pulse period of the voltage sweep signal; and
a pulse graphing function configured to trace a pulse waveform corresponding to the selectable pulsed voltage, to display the measurement period and delay to start the measurement period, to indicate period time values for the measurement period and pulse period of the voltage sweep signal, and to super-impose the pulse waveform trace on a display of I-V waveforms on the waveform monitor.

19. The device analyzer of claim 1 where the collector supply, the supply voltage generator, the supply switch, the supply switch driver, the voltmeter, and the current meter are implemented in a high current curve trace module, the device analyzer further comprising:
an analyzer housing comprising a plurality of module bays, each module bay configured to support the high current curve trace module, and at least another curve trace module comprising hardware and software components configured to perform measurements for characterizing a device;
a module interconnect configured to provide electrical and control connectivity to the high current curve trace module and the at least another curve trace module;
a waveform monitor connected to the module interconnect to display voltage and current measurements from the high current curve trace module and the at least another curve trace module in user-configurable traces;
a device analyzer controller configured to control operation of the high current curve trace module and the at least another curve trace module and the waveform monitor; and
a test probe module configured to provide connections from a selected one of either the high current curve trace module or the at least one other curve trace module, where:
the first DUT port is implemented as a first probe that contacts a first terminal of the DUT during measurement; and
the second DUT port is implemented as a second probe that contacts a second terminal of the DUT during a measurement.

* * * * *